(12) United States Patent
Ippolito et al.

(10) Patent No.: US 11,368,165 B2
(45) Date of Patent: Jun. 21, 2022

(54) CONVERTER CIRCUIT, CORRESPONDING DEVICE AND OFFSET COMPENSATION METHOD

(71) Applicant: STMicroelectronics S.r.l., Agrate Brianza (IT)

(72) Inventors: Calogero Marco Ippolito, Aci Castello (IT); Michele Vaiana, San Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/211,355

(22) Filed: Mar. 24, 2021

(65) Prior Publication Data
US 2021/0314000 A1 Oct. 7, 2021

(30) Foreign Application Priority Data
Apr. 2, 2020 (IT) .................. 102020000007021

(51) Int. Cl.
*H03M 1/06* (2006.01)
*H03M 3/00* (2006.01)

(52) U.S. Cl.
CPC .......... *H03M 3/356* (2013.01); *H03M 3/464* (2013.01)

(58) Field of Classification Search
CPC ...... H03M 3/356; H03M 3/464; H03M 3/458; H03M 3/348; H03M 3/494; H03M 1/12; H03M 1/66; H03M 1/06; H03M 1/1023
USPC .......................................... 341/118, 155, 144
See application file for complete search history.

(56) References Cited

U.S. PATENT DOCUMENTS

| 4,342,983 A * | 8/1982 | Weigand | H03M 1/10 341/120 |
| 4,427,971 A * | 1/1984 | Whiteside | H03M 1/204 341/118 |
| 4,544,917 A * | 10/1985 | Lenhoff, Jr. | H03M 1/16 341/158 |
| 4,618,850 A * | 10/1986 | Lenhoff, Jr. | H03M 1/46 341/118 |
| 4,893,316 A * | 1/1990 | Janc | H03C 3/40 341/110 |

(Continued)

FOREIGN PATENT DOCUMENTS

EP 1178637 A1 2/2002
WO 2007144593 A1 12/2007

*Primary Examiner* — Jean B Jeanglaude
(74) *Attorney, Agent, or Firm* — Slater Matsil, LLP

(57) ABSTRACT

A converter circuit includes an analog-to-digital signal conversion path. An input port receives an analog input signal having an offset, and an output port delivers a digital output signal quantized over M levels. The digital output signal is sensed by a digital-to-analog feedback path, which includes a digital-to-analog converter applying to the input port an analog feedback signal produced as a function of an M-bit digital word under control of a two-state signal having alternating first and second states. M-bit digital word generation circuitry coupled to the digital-to-analog converter and sensitive to the two-state signal produces, alternately, during the first states, a first M-bit digital word, which is a function of the digital output signal quantized over M levels, and, during the second states, a second M-bit digital word, which is a function a correction value of the offset in the analog input signal.

20 Claims, 15 Drawing Sheets

(56) References Cited

U.S. PATENT DOCUMENTS

| | | | | |
|---|---|---|---|---|
| 5,107,265 | A * | 4/1992 | Sloane | H03M 1/44 |
| | | | | 341/146 |
| 5,153,593 | A * | 10/1992 | Walden | H03M 3/354 |
| | | | | 341/143 |
| 5,392,042 | A * | 2/1995 | Pelion | H03M 3/404 |
| | | | | 333/166 |
| 6,420,991 | B1 * | 7/2002 | Yu | H03M 1/0673 |
| | | | | 341/118 |
| 7,545,302 | B1 * | 6/2009 | Silva | G06J 1/00 |
| | | | | 341/143 |
| 8,212,699 | B1 | 7/2012 | Nilsson et al. | |
| 8,750,413 | B2 * | 6/2014 | Ginetti | H03L 7/0994 |
| | | | | 375/296 |
| 2006/0097899 | A1 | 5/2006 | Nagai | |
| 2013/0064324 | A1 * | 3/2013 | Ginetti | H03M 3/41 |
| | | | | 375/296 |
| 2020/0256898 | A1 | 8/2020 | Vaiana et al. | |
| 2020/0259474 | A1 | 8/2020 | Ippolito et al. | |

\* cited by examiner

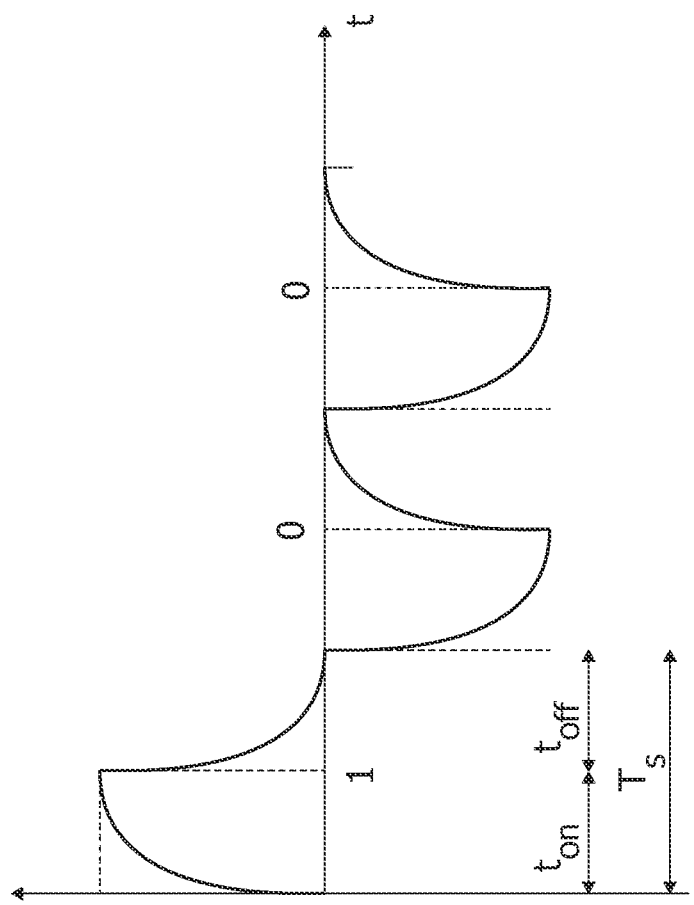

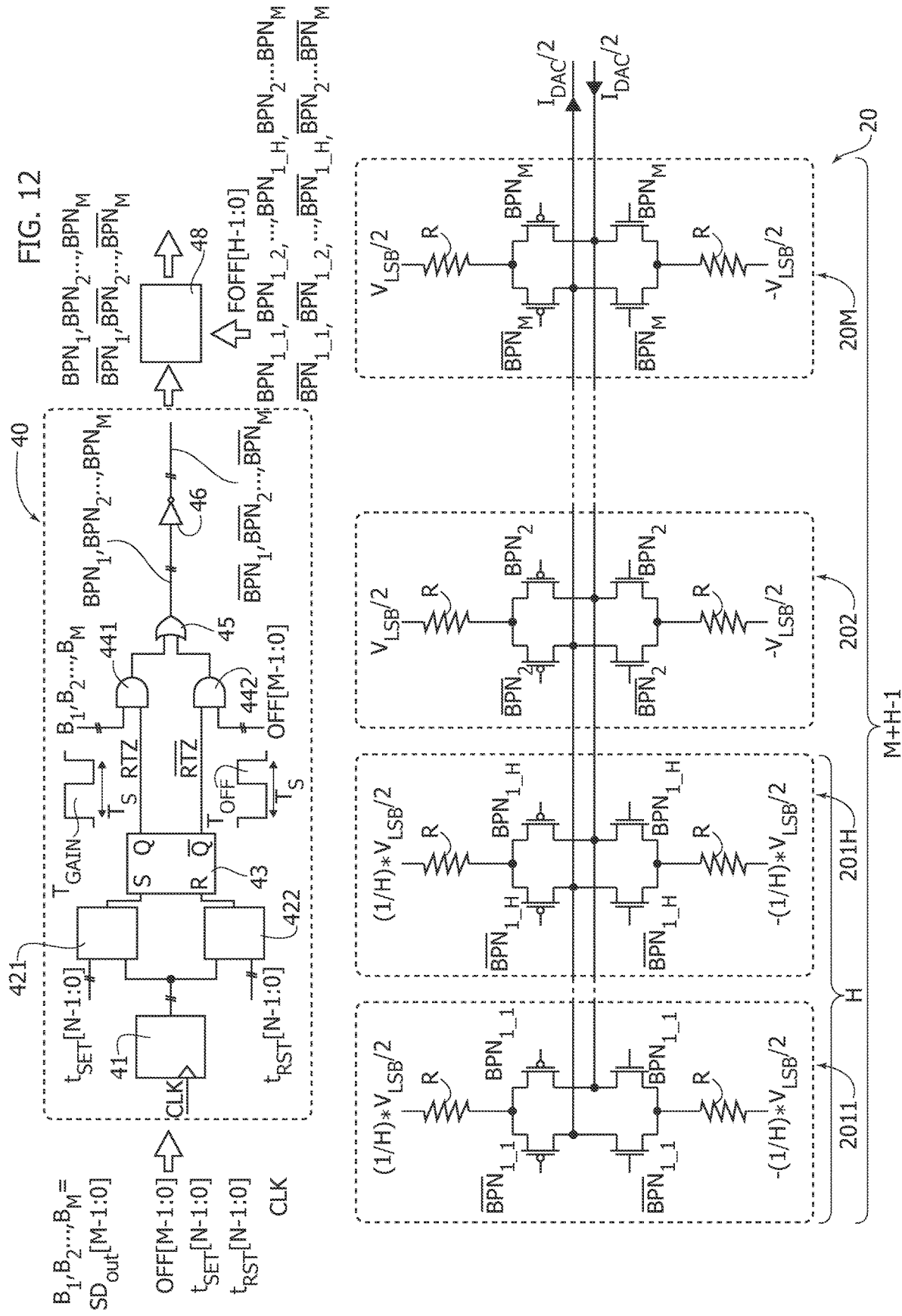

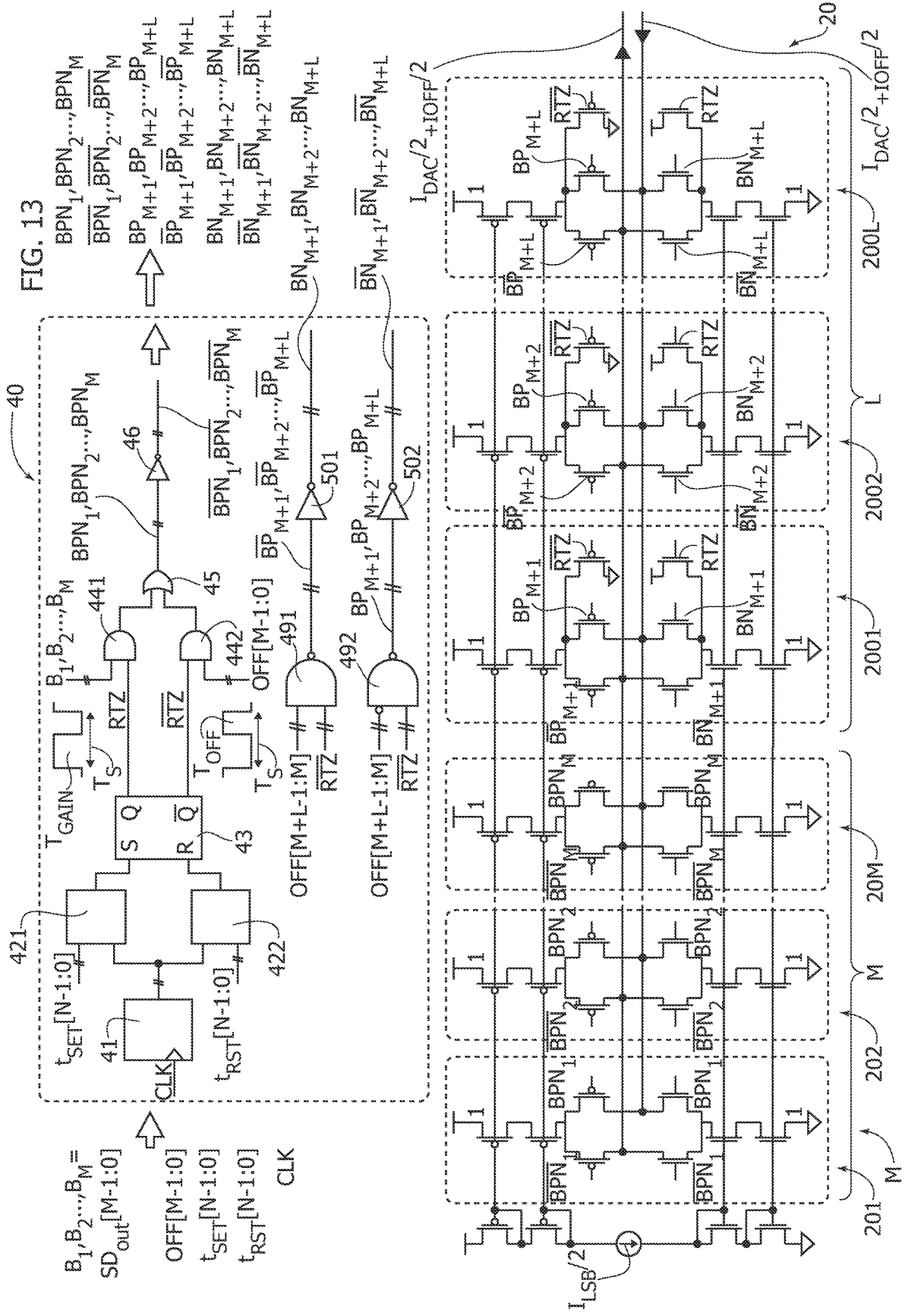

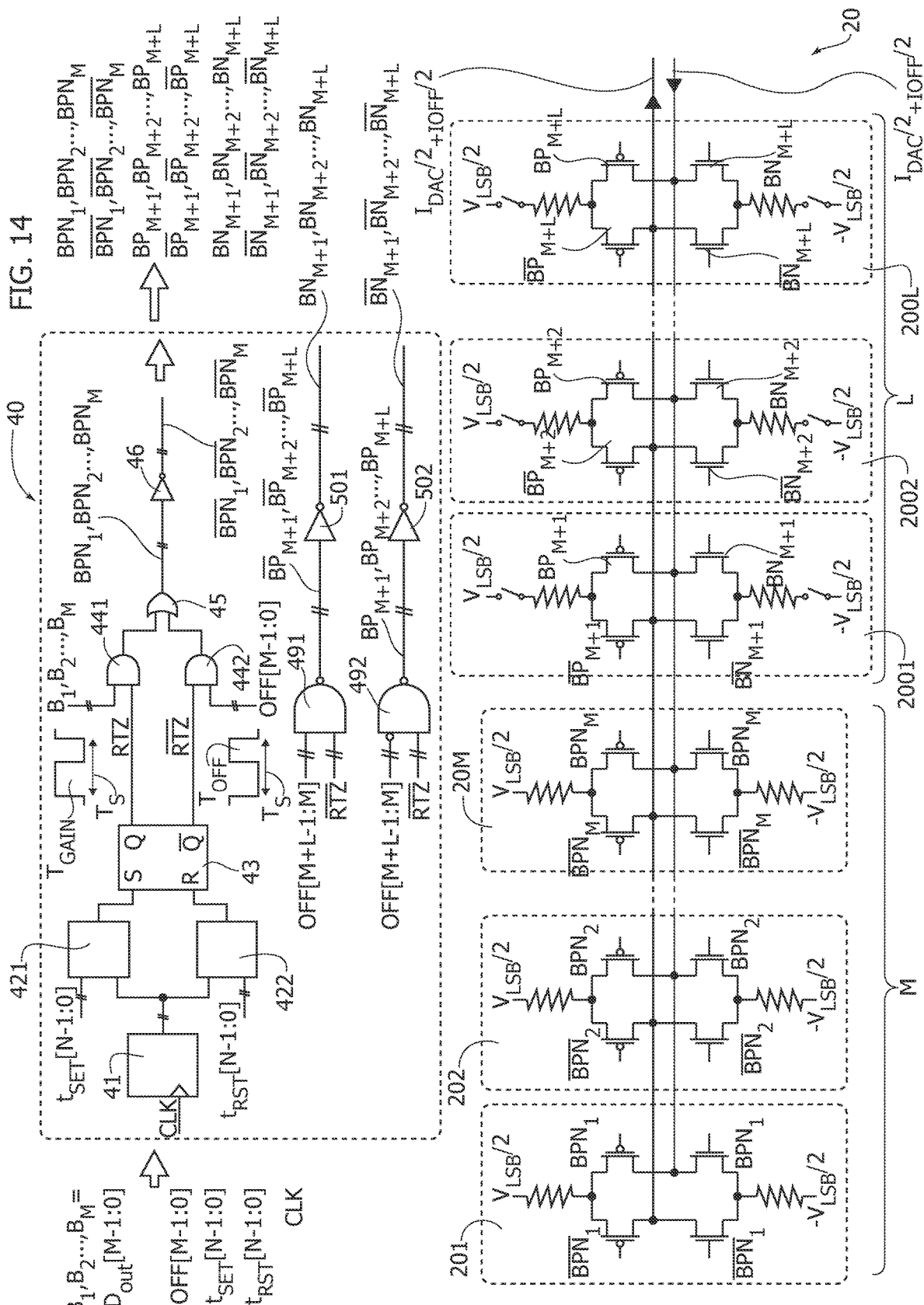

CONVERTER CIRCUIT, CORRESPONDING DEVICE AND OFFSET COMPENSATION METHOD

CROSS-REFERENCE TO RELATED APPLICATIONS

This application claims the benefit of Italian Application No. 102020000007021, filed on Apr. 2, 2020, which application is hereby incorporated herein by reference.

TECHNICAL FIELD

The description relates to converter circuits, corresponding devices and offset compensation methods.

BACKGROUND

In integrated sensor applications, an electronic interface can receive as an input an analog (current/voltage) signal from a sensor. Increasing (maximizing) the signal/noise ratio is facilitated by the dynamics of the analog-to-digital converter (ADC) being covered as widely as possible—notionally entirely—by the "useful" signal from the sensor, which is a function of the physical quantity to be measured.

The signal produced by the sensor comprises a "useful" signal having superposed an offset signal, with such an offset oftentimes (much) stronger than the useful signal. This situation militates against directly amplifying and converting to digital the signal from the sensor, which suggests subtracting the offset component first.

Also, in industrial production of integrated sensors, variations in the production process of the sensor (and the amplifier/converter circuitry associated with the sensor) may result in signals expected to be similar if not identical to exhibit notable variations from device to device.

For that reason, calibration techniques can be adopted in order to subtract from each device a respective offset value. This involves providing additional circuits for calibrating the sensor offset before amplification and conversion into the digital domain.

A wide range of applications related to integrated sensors (in areas such as, e.g., mobile phones, smart homes, Internet of Things (IoT), security applications) may benefit from the ability to deal with the offset with low power consumption and reduced occupation of semiconductor area. The ability to design ADC converters with low-power-consumption and low area occupation is thus a goal worth being pursued.

SUMMARY

One or more embodiments are applicable, for instance, to the area of integrated sensors, where effective and reliable electronic interfaces are desirable with the capability of amplifying and converting to digital analog information generated by a sensor.

Environmental sensors, high-performance interfaces, temperature sensors, infrared (IR) sensors, presence and motion detection sensors, gas flow sensors are exemplary of sensors to which one or more embodiments can be can be applied in "smart" mobile devices, for instance.

An object of one or more embodiments is to contribute in improving offset compensation performance of converters as discussed previously in terms of power consumption and semiconductor area occupied.

According to one or more embodiments, that object can be achieved by means of a circuit having the features set forth in the claims that follow.

One or more embodiments may relate to a corresponding device. A sensor arrangement as discussed in the introductory portion of this description may be exemplary of such a device.

One or more embodiments may relate to a corresponding method.

The claims are an integral part of the technical teaching provided herein in respect of illustrative embodiments.

One or more embodiments provide an offset compensation technique that can be effectively used in continuous-time delta-sigma converters with return-to-zero (RTZ) digital-to-analog converters (DACs).

In one or more embodiments, offset correction/compensation can be performed within a digital-to-analog converter (DAC) in a delta-sigma converter while avoiding additional semiconductor area occupied and additional current consumption.

In one or more embodiments, offset can be compensated without additional circuitry and current consumption.

One or more embodiments facilitate providing converters with notable performance in terms of area and current consumption.

One or more embodiments provide an offset compensation technique suited for use in continuous time delta-sigma converters with return-to-zero DAC.

One or more embodiments avoid using additional circuits for offset correction of the input signal, insofar as correction is performed within a DAC in the feedback loop of the converter.

One or more embodiments facilitate reducing current consumption insofar as offset correction is obtained by using a part of an electric current which would otherwise be left unused (and unnecessarily dissipated) in the DAC.

Applicability of one or more embodiments is not limited to the area of amplifier and converter interfaces for sensors, and can be extended to all the domains of possible application of electronic interfaces for amplification and conversion based on converters such as continuous-time delta-sigma converters which comprise a return-to-zero (RTZ) DAC.

BRIEF DESCRIPTION OF THE DRAWINGS

One or more embodiments will now be described, by way of example only, with reference to the annexed figures, wherein:

FIG. 3A is a time diagram exemplary of possible operation of a converter according to FIG. 1 including details as per FIG. 3;

FIG. 12 is a circuit diagram illustrative of possible developments of a voltage-based converter according to FIG. 6;

FIG. 13 is a circuit diagram illustrative of possible developments of a current-based converter according to FIG. 5; and FIG. 14 is a circuit diagram illustrative of possible developments of a voltage-based converter according to FIG. 6.

DETAILED DESCRIPTION OF ILLUSTRATIVE EMBODIMENTS

In the following description various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings/references provided herein are for convenience only, and therefore do not interpret the extent of protection or scope of the embodiments.

Figure 1:
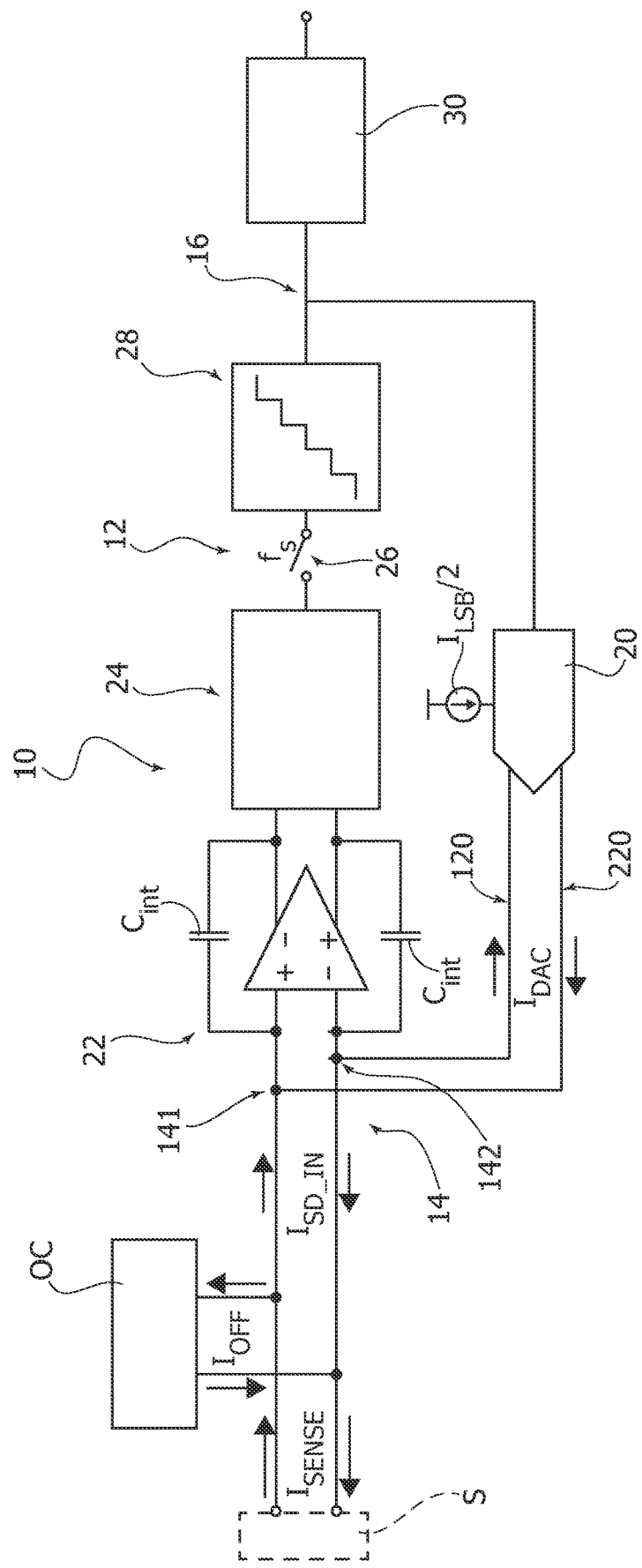
FIG. 1 is a block diagram of a conventional converter in a current-based implementation.
Figure 2:
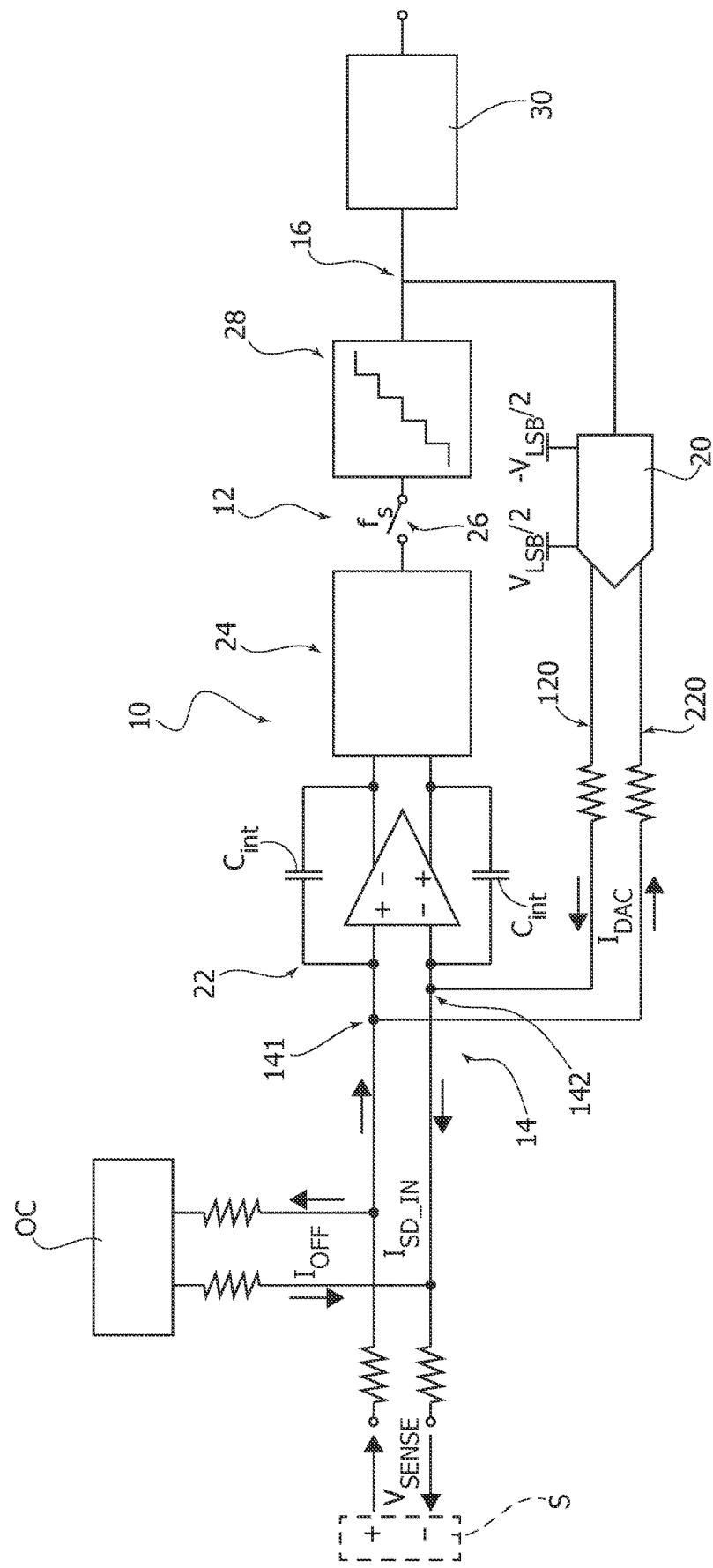
FIG. 2 is a block diagram of a conventional converter in a voltage-based implementation.

The diagrams of FIGS. 1 and 2 are exemplary of the architecture of a conventional (continuous time) delta-sigma converter 10 comprising an analog-to-digital signal conversion path 12: from an input port 14 configured to receive an analog input signal affected by an offset (that is likely to have a certain offset superposed thereon), and to an output port 16 configured to deliver a digital output signal quantized over M levels as a result of (delta-sigma) conversion to digital of the analog input signal applied at the input port 14.

As illustrated in FIGS. 1 and 2, the converter 10 also comprises a digital-to-analog feedback path 18 from the output port 16 to the input port 14. The feedback path 18 comprises a digital-to-analog converter 20 configured to sense and convert to analog the digital output signal at the output port 16 and to apply an analog feedback signal at the input port 14 of the analog-to-signal conversion path 12.

In a possible, advantageous "differential" implementation as illustrated in FIGS. 1 and 2, the input port 14 to the analog-to-digital conversion path comprises a differential input with a first input node 141 and a second input node 142 to a (fully) differential amplifier 22 having capacitive output-input feedback paths (see the capacitors $C_{int}$) providing integrator-like operation of the amplifier 22.

The (differential) output from the amplifier/integrator 22 is supplied to a "rest-of-loop" filter 24 which in turn supplies via a "sampling" switch 26 operated at a frequency $f_s$ a M-level quantizer 28 which provides the digital output signal at the output port 16.

Optionally, a digital decimation filter 30 can be arranged downstream the output port 16 in order to correspondingly filter the digital output signal at the output port 16.

As illustrated in both FIGS. 1 and 2, the first input node 141 and the second input node 142 are configured to receive a (differential) analog input current signal $I_{SD\_IN}$ applied thereto.

In current-based implementations as illustrated in FIG. 1, the differential analog input current signal $I_{SD\_IN}$ is expected to be obtained from a sensor S generating a sensing signal in the form of a sensing current $I_{SENSE}$.

In voltage-based implementations as illustrated in FIG. 2, the differential analog input current signal $I_{SD\_IN}$ is expected to be obtained via voltage-to-current translator resistors (shown but not expressly labeled in FIG. 2 for simplicity) from a sensor S which generates a sensing signal in the form of a sensing voltage $V_{SENSE}$.

As illustrated in both FIGS. 1 and 2, the digital-to-analog converter 20 in the digital-to-analog feedback path 18 comprises a first output line 120 and a second output line 220 configured to apply (inject) an analog feedback (current) signal at the first input node 141 and the second input node 142 of the input port 14 of the analog-to-digital signal conversion path 12.

As illustrated in both FIGS. 1 and 2, the digital-to-analog converter 20 in the digital-to-analog feedback path 18 is configured to be coupled (as discussed in the following) to compensation sources such as a generator of a current of intensity $I_{LSB}/2$ (current-based implementation of FIG. 1) or generators of voltages $+V_{LSB}/2$, $-V_{LSB}/2$ (voltage-based implementation of FIG. 2).

Here again:

in current-based implementations as illustrated in FIG. 1, the differential analog feedback current signal injected at the first input node 141 and the second input node 142 of the input port 14 of the analog-to-digital signal conversion path 12 is expected to be obtained from the digital-to-analog converter 20 as a current signal;

in voltage-based implementations as illustrated in FIG. 2, the differential analog feedback current signal injected at the first input node 141 and the second input node 142 of the input port 14 of the analog-to-digital signal conversion path 12 is obtained starting from voltage signals produces by the digital-to-analog converter 20 via voltage-to-current translator resistors (again shown but not expressly labeled for simplicity in FIG. 2).

In conventional converters as exemplified in FIGS. 1 and 2 the DAC 20 can be realized using a return-to-zero (RTZ) technique to limit the degradation of the signal-to-noise ratio (SNR) due to clock jitter. In fact, it is possible to demonstrate that, in a converter as considered herein, the SNR using a DAC with an RTZ signal with a duty cycle $DC_{RTZ}=t_{on}/(t_{on}+t_{off})$ is lower by a factor $(DC_{RTZ}/2)^{1/2}$ than the SNR obtained without using a RTZ DAC.

In the circuit of FIG. 1 the input signal to the converter 10 is a current signal $I_{SD\_IN}$, and consequently the DAC 20 in the converter is "current-based", namely configured to produce at its output an (analog) current signal $I_{DAC}$ to be combined with (subtracted from, for instance) the input current signal.

In FIG. 1, the current from the sensor S (to be amplified and converted to digital) is designated $I_{SENSE}$. An offset component $I_{OFF}$ present in $I_{SENSE}$ can be determined during a calibration phase and subtracted via an input signal offset correction circuit OC so that current signal $I_{SD\_IN}$ applied to the converter input (to be amplified and converted into digital) includes only a "useful" signal component (which is a function of the physical entity to be measured) from the sensor S. The $I_{OFF}$ current can thus be a fixed current (in DC) estimated during the calibration phase.

In FIG. 2, the signal from the sensor S is a voltage signal designated $V_{SENSE}$, which can be converted into a current signal via voltage-to-current translator resistors (shown but not expressly labelled for simplicity on the left-hand side of FIG. 2). Here again, an offset component $I_{OFF}$ can be determined during a calibration phase and subtracted via an input signal offset correction circuit OC. As exemplified in FIG. 2, the circuit OC can generate the offset current $I_{OFF}$ as a voltage signal designated which is converted into a current signal via voltage-to-current translator resistors (again shown but not expressly labeled for simplicity on the left-hand side of FIG. 2).

In FIG. 2 the DAC 20 in the converter is "voltage-based", namely configured to produce at its output an (analog) voltage signal with the current $I_{DAC}$ to be combined with the input current signal produced via voltage-to-current translator resistors (shown but not expressly labelled for simplicity on the left-hand side of FIG. 2) with a voltage drop imposed across each resistor with respect to the virtual ground voltage of the amplifies 22 at the converter input.

Irrespective of possible differences in implementation details (current-based v. voltage-based) the same operating criteria apply to the converters illustrated in FIG. 1 and in FIG. 2. In both instances, input signal offset correction circuitry (primarily, the block designated OC) is provided which has a cost both in terms of semiconductor area occupied and in terms of current consumption.

Figure 3:
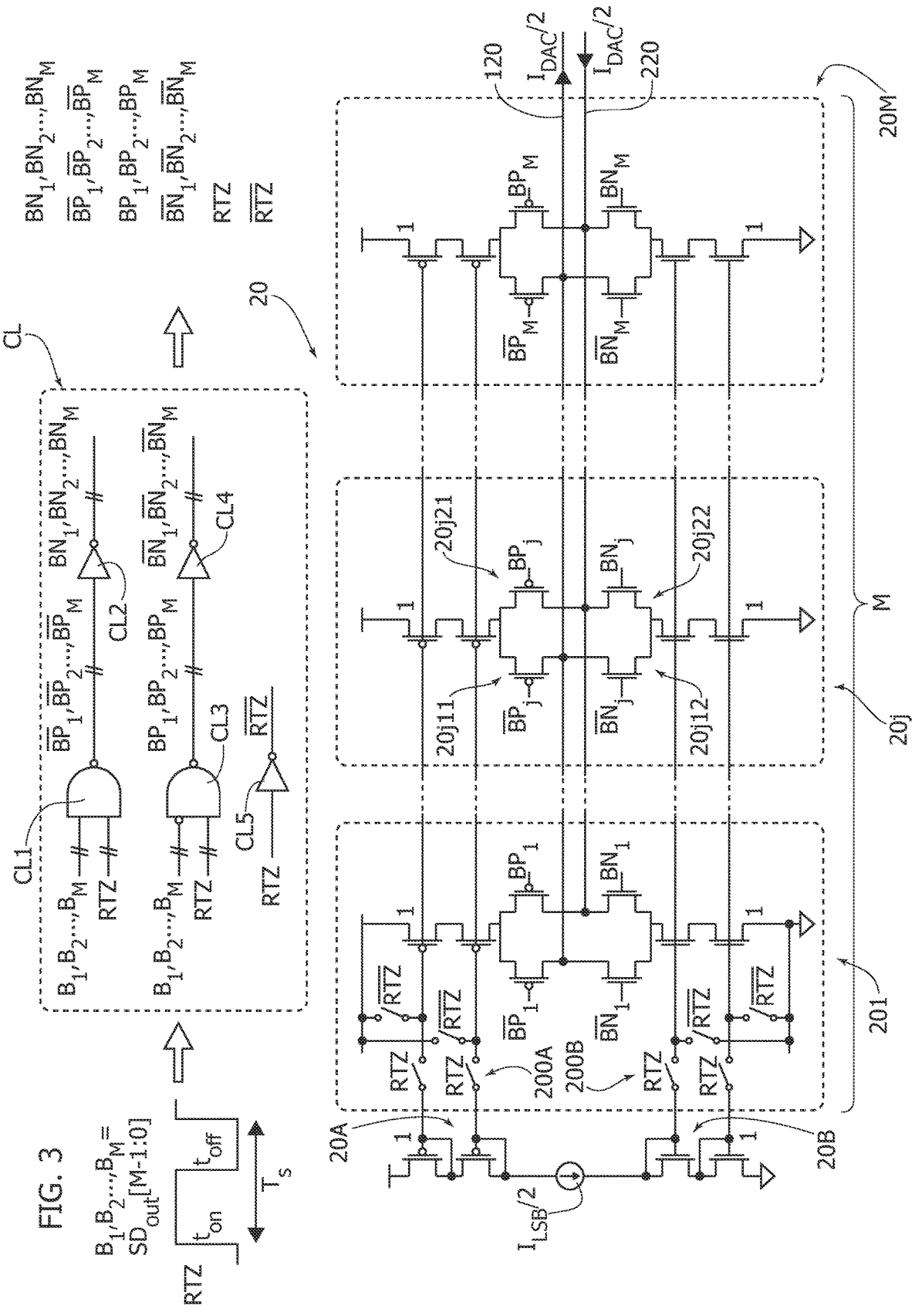
FIG. 3 is a circuit diagram illustrating possible details of converter according to FIG. 1.
Figure 4:
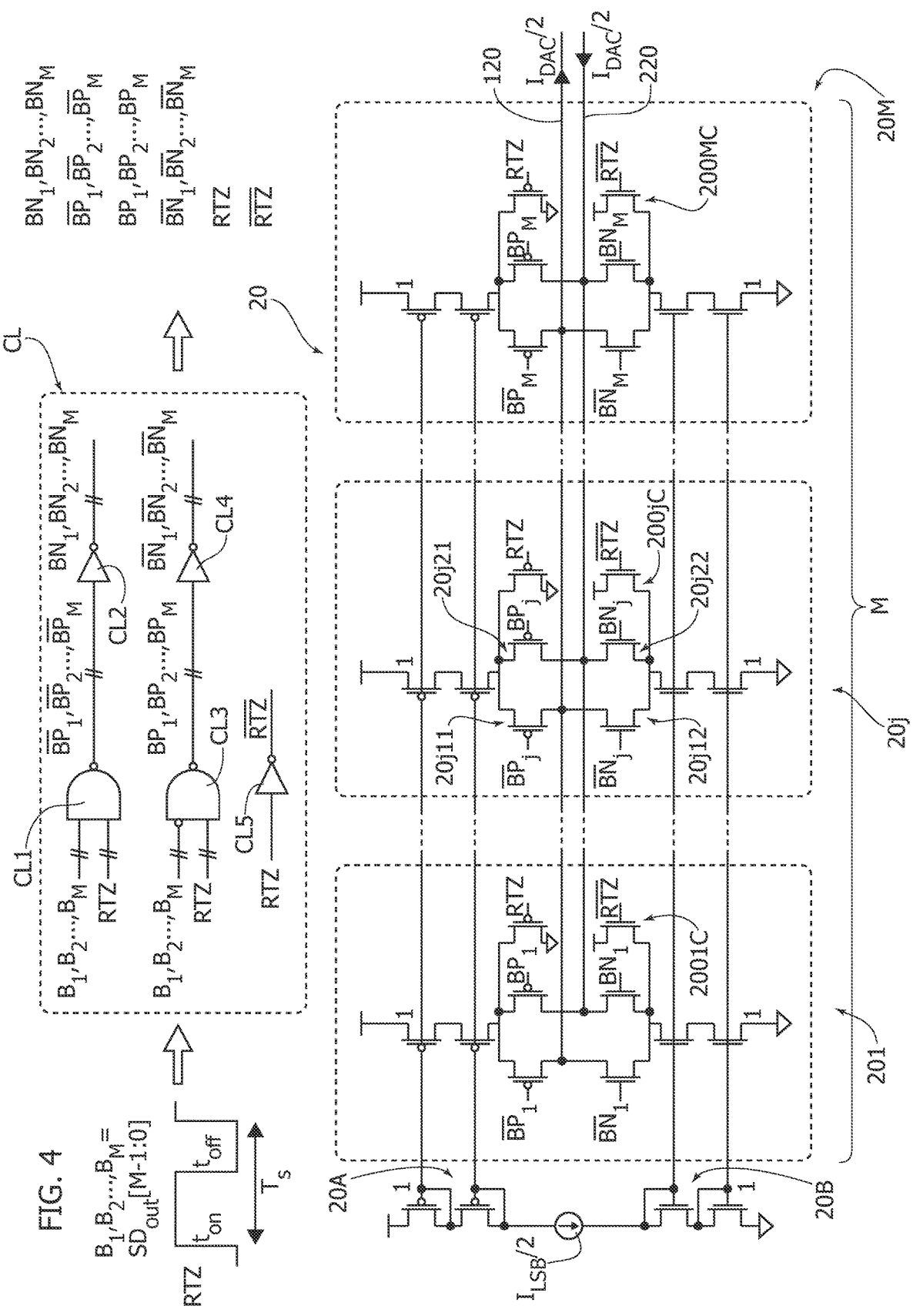
FIG. 4 is a circuit diagram illustrating possible details of a converter according to FIG. 3.

FIG. 3 and FIG. 4 are illustrative of possible conventional implementations of a RTZ DAC circuit 20 for use in the (current-based) architecture of FIG. 1.

Similar implementations are feasible for voltage-based architectures as exemplified in FIG. 2, which will not be discussed in detail for brevity.

Essentially, in both instances illustrated in FIGS. 3 and 4 the digital-to-analog converter 20 comprises a plurality of M electronic switch (bias) cells 201, ..., 20$j$, ..., 20M where M equals the number of levels of the quantizer 28.

The electronic switch cells 201, ..., 20$j$, ..., 20M comprise electronic switches such as transistors. Metal-oxide-semiconductor field-effect transistor (MOSFET) transistors (both P-type and N-type) are exemplary of such electronic switches which can be made selectively conductive or non-conductive with the current flow path therethrough (source-drain in the case of field-effect transistors such as MOSFETs) made current-pervious or current-impervious as a function of a (logic) signal applied to a control electrode (gate, in the case of field-effect transistors such as MOSFETs).

Whatever the implementation details (for instance the logic control signals applied to the MOSFET gates can take opposite values depending on whether a P-type or a N-type transistor is used to implement a certain electronic switch at a certain location), the cells 201, ..., 20$j$, ..., 20N are switchable under the control of a logic signal RTZ (or the negated version thereof, namely $\overline{RTZ}$) between:

a conductive state, during which the cells 201, ..., 20$j$, ..., 20N electrically couple the first output line 120 and the second output line 220 of the DAC 20 to a first signal source 20A and a second signal source 20B, respectively, and a non-conductive state during which the first and second output lines 120, 220 are decoupled from the first and second signal sources 20A and 20B.

In the—purely exemplary—case considered herein, the cells 201 to 20M comprise (reference is made to a generic cell 20$j$ with $j=1, \ldots, M$):

a first electronic switch pair 20$j$11, 20$j$12 comprising a first and a second electronic switch (P-MOS and N-MOS transistors, for instance) which, during their conductive state, couple the first output line 120 to the first signal source 20A and the second signal source 20B, respectively, a second electronic switch pair 20$j$21, 20$j$22 comprising a (further) first and a (further) second electronic switch (P-MOS and N-MOS, transistors for instance) which, during their conductive state, couple the second output line 220 to the first signal source 20A and the second signal source 20B respectively.

Control nodes (gates in the case of field effect transistors such as MOSFET transistors) are provided configured to selectively provide a conductive state of these switches (transistors) 20$j$11, 20$j$12, 20$j$21, 20$j$22 as a function of the logical state of a respective digital signal applied thereto.

A DAC 20 relying on a "thermometric" code will be considered here for simplicity, with no limiting intent on embodiments.

In such a "thermometric" code, with M=3, for instance:
a level "0" corresponds to all the 3 bits being equal to zero,
a level "1" corresponds to a first bit being equal to one and second and third bit being equal to zero,
a level "2" correspond to the first two bits being equal to one and the third being equal to zero, a level "3" corresponds to all the 3 bits being equal to one.

Byway of contrast with such a "thermometric" arrangement, where one, two and three bits are subsequently made equal to one (just like the lines or bars of a thermometer) in a binary code, two bits are used to represent the numbers from 0 to 3, namely 00, 01, 10, 11.

For representing the numbers from 0 to 7:
seven bits are used with a thermometric coding (a possible "thermometric" count sequence from 0 to 7 being 0000000, 0000001, 0000011, 0000111, 0001111, 0011111, 0111111, 1111111)
three bits are used to count with a binary code (a possible count sequence from 0 to 7 being 000, 001, 010, 011, 100, 101, 110, 111).

A DAC as considered herein by way of example using a thermometric coding may include 7 branches, with each branch providing a unitary current (for example 7 branches with a current 1*I each).

A same type of DAC operation could be achieved by considering branches with a current value weighed in a binary mode and driven via a binary code: for instance, in an exemplary case with a count from 0 to 7 one might use three branches, providing respective currents with values 4*I, 2*I and 1*I driven with the three bits of the corresponding binary representation.

A DAC as exemplified in FIG. 3 (assuming again to refer to M=7 as an example) can produce a differential current $I_{DAC}$ as the sum of $(I_{DAC}/2)\_PMOS$—as produced by the PMOS transistors illustrated—and $(I_{DAC}/2)\_NMOS$—as produced by the NMOS transistors illustrated.

More specifically, the following may thus apply:
level "0"→$(IDAC/2)\_PMOS=-I-I-I-I-I-I-I=-7*I$ and $(IDAC/2)\_NMOS=-I-I-I-I-I-I-I=-7*I$, and therefore $IDAC=(-14*I)/2=-7*I$;

level "1"→(IDAC/2)_PMOS=-I-I-I-I-I+I=-5*I and (IDAC/2)_NMOS=-I-I-I-I-I+I=-5*I, and therefore IDAC=(-10*I)/2=-5*I; and, similarly:
    level "2"→IDAC=(-6*I)/2=-3*I,
    level "3"→IDAC=(-2*I)/2=-1*I,
    level "4"→IDAC=(+2*I)/2=+1*I,
    level "5"→IDAC=(+6*I)/2=+3*I,
    level "6"→IDAC=(+10*I)/2=+5*I,
    level "7"→IDAC=(+14*I)/2=+7*I.

As discussed, a same type of DAC operation could be achieved by considering branches with current values weighed in a binary mode and driven via a binary code.

The following discussion refers to arrangements where the transistors 20j11, 20j12 are P-MOS and the transistors 20j21, 20j22 are N-MOS receiving at the control electrodes (gates) logic signals produced by (combinational) logic circuitry CL shown at the top of the figure. This logic circuitry is driven by a return-to-zero signal RTZ produced by associated circuitry not visible in the figures for simplicity. The signal is an on-off (two-state) signal with a period Ts comprising an "on" time or state $t_{on}$ and an "off" time or state $t_{off}$, thus with a duty cycle given by $t_{on}/(t_{on}+t_{off})$.

FIGS. 3 and 4 provide just possible examples of how operation of the cells 201, ..., 20j, ..., 20N as discussed previously can be obtained as a function of RTZ (possibly including the binary complementary or negated version thereof, namely $\overline{RTZ}$) and other logical signals generated by logic circuitry CL as exemplified at the top of the figures.

Those of skill in the art (this will similarly apply to FIGS. 8 to 14 which are discussed in the following in connection with various embodiments) may devise a variety of alternative solutions where the same operation of the cells 201, ..., 20j, ..., 20N can be obtained as a function of RTZ using different circuitry, for instance if different types of switches (are used for 20j11, 20j12, 20j21, 20j22 (N-MOS in the place of P-MOS, just to make an example).

In the (purely exemplary) case illustrated in FIG. 3:

when the signal RTZ=0 (and therefore $\overline{RTZ}$=1) the gates of the bias PMOS (20j11, 20j12, for instance) are connected to a supply voltage VDD and the gates of the bias NMOS (20j21, 20j22, for instance) are connected to GND: in other words, the current mirrors implemented thereby are off, so that the (differential) output current $I_{DAC}$ at the lines 120, 220 equals zero;

when the RTZ=1 the $I_{DAC}$ current depends on a M bit digital word called SDout [M-1: 0], which—in a case as exemplified—can be assumed to be simply the digital output from the M bit converter 28, designated $B_1, B_2, \ldots, B_M$).

A (M-bit) logic circuit as exemplified at CL comprises:
    a NAND gate CL1 receiving as inputs $B_1, B_2, \ldots, B_M$ and RTZ and having cascaded therewith an inverter CL2;
    a NAND gate CL3 receiving as inputs $B_1, B_2, \ldots, B_M$ (at a logically inverted input) and RTZ and having cascaded therewith an inverter CL4;
    an inverter CL5 producing $\overline{RTZ}$ from RTZ.

In the exemplary case of FIG. 3:
    if RTZ=1 and $B_1, B_2, \ldots, B_M$=0, then $BP_1, BP_2, \ldots, BP_M$=0 ($\overline{BP_1}, \overline{BP_2}, \ldots, \overline{BP_M}$=1) and $BN_1, BN_2, \ldots, BN_M$=0 ($\overline{BN_1}, \overline{BN_2}, \ldots, \overline{BN_M}$=1) and therefore the current output from the DAC is equal to $I_{DAC}$=(-1-1 ... -1)*$I_{LSB}$=-M*$I_{LSB}$.

The value $I_{LSB}$ is an "elementary" current contribution related to the least significant bit (LSB) in the M-bit word from the quantizer 28. This is generated by a current generator (of any known type) providing a current of intensity $I_{LSB}/2$ between the sources 20A, 20B implemented (by way of example) as diode-connected "upper" (20A) and "lower" (20B) transistor pairs having the current flow paths therethrough (source-drain, in the exemplified case of field-effect transistors such as MOSFET transistors) traversed by a current set by the generator of $I_{LSB}/2$. These control electrodes (gates, in the exemplified case of field-effect transistors such as MOSFET transistors) are configured to be coupled in a current-mirror arrangement (via corresponding switch pairs 200A, 200B controlled by RTZ) to "head" and "tail" transistors pairs included in the various cells 201, ..., 20j, ..., 20M upstream and downstream of the transistor pairs 20j11, 20j12, 20j21, 20j22 (j=1, ..., M)

If RTZ=1 and $B_1$=1, $B_2, \ldots, B_M$=0, then $BP_1$=1, $BP_2, \ldots, BP_M$=0 ($\overline{BP_1}$=0, $\overline{BP_2}, \ldots, \overline{BP_M}$=1) and $BN_1$=1, $BN_2, \ldots, BN_M$=0 ($\overline{BN_1}$=0; $\overline{BN_2}, \ldots, \overline{BN_M}$=1) and therefore the current flow output from the DAC 20 is equal to $I_{DAC}$=(+1-1 ... -1)*$I_{LSB}$=(-M+2)*$I_{LSB}$.

And so on, if RTZ=1 and $B_1, B_2, \ldots, B_M$=1 then $BP_1, BP_2, \ldots, BP_M$=1 ($\overline{BP_1}, \overline{BP_2}, \ldots, \overline{BP_M}$=0) and $BN_1, BN_2, \ldots, BN_M$=1 ($\overline{BN_1}, \overline{BN_2}, \ldots, \overline{BN_M}$=0) and therefore the current output from the DAC is equal to $I_{DAC}$=(+1+1 ... +1)*$I_{LSB}$=M*$I_{LSB}$.

A noted disadvantage of the architecture of FIG. 3 lies in that the switching on and off of the bias currents supplied to the differential pairs is characterized by the associated on and off switching time constants (this is exemplified in FIG. 3A) which, moreover, will also depend process, temperature and voltage variations.

This results in a deviation of the output signal from the "ideal" desired signal and a degradation in SNR.

Such a disadvantage, which becomes more evident as the sampling frequency $f_s$ (ideally represented by the switch 26 upstream of the quantizer 28) increases, can be addressed by resorting to a solution as exemplified in FIG. 4.

In FIG. 4, parts or elements like parts or element as already discussed in connection with the previous figures are indicated by like reference symbols, so that a detailed description will not be repeated here for brevity.

Comparison with FIG. 3 facilitates understanding that, in an arrangement as exemplified in FIG. 4, the switch arrangement 200A, 200B controlled by RTZ (as exemplified in FIG. 3) is no longer present and the M cells 201, ..., 20j, ..., 20M are always kept on by additional switches (NMOS and PMOS transistors 2001C, ..., 200jC, ..., 200MC, for instance) controlled by the signals RTZ and $\overline{RTZ}$ which direct the current flow towards GND or VDD when RTZ=0 (and therefore $\overline{RTZ}$=1).

The disadvantage discussed previously is therefore overcome at the cost of an increase in current consumption: in fact during the phase/state with RTZ=0 the current flows (in a useless manner) towards GND and towards VDD.

In fact when the signal RTZ=0, $\overline{RTZ}$=1, with $BP_1, BP_2, \ldots, BP_M$=1, and $\overline{BP_1}, \overline{BP_2}, \ldots, \overline{BP_M}$=1, $BN_1, BN_2, \ldots, BN_M$=0, and $\overline{BN_1}, \overline{BN_2}, \ldots, \overline{BN_M}$=0. In other words, the unit currents of the DAC 20 flow towards GND through the PMOS driven via RTZ and towards VDD through the NMOS driven via $\overline{RTZ}$.

When RTZ=0, $I_{DAC}$=0 and when RTZ=1 the $I_{DAC}$ current depends on the M-bit digital word called SDout [M-1: 0] (here again that digital word can be assumed to coincide with the M-bit digital output of the quantizer 28.

In fact, if RTZ=1 and $B_1, B_2, \ldots, B_M$=0 one has $BP_1, BP_2, \ldots, BP_M$=0 ($\overline{BP_1}, \overline{BP_2}, \ldots, \overline{BP_M}$=1) and $BN_1, BN_2, \ldots, BN_M$=0 ($\overline{BN_1}, \overline{BN_2}, \ldots, \overline{BN_M}$=1) and therefore the current output from the DAC 20 is equal to $I_{DAC}$=(-1-1 ... -1)*$I_{LSB}$=-M*$I_{LSB}$.

If RTZ=1 and $B_1$=1, $B_2, \ldots, B_M$=0 one has $BP_1$=1, $BP_2, \ldots, BP_M$=0 ($\overline{BP_1}$=0, $\overline{BP_2}, \ldots, \overline{BP_M}$=1) and $BN_1$=1, $BN_2, \ldots, BN_M=0$ ($\overline{BN_1}=0, \overline{BN_2}, \ldots, \overline{BN_M}=1$) and therefore the current flow output from the DAC 20 is equal to $I_{DAC}=(+1-1 \ldots -1)*I_{LSB}=(-M+2)*I_{LSB}$.

And so on, if RTZ=1 and $B_1, B_2, \ldots, B_M=1$, then $BP_1$, $BP_2, \ldots, BP_M=1$ ($\overline{BP_1}, \overline{BP_2}, \ldots, \overline{BP_M}=0$) and $BN_1$, $BN_2, \ldots, BN_M=1$ ($\overline{BN_1}, \overline{BN_2}, \ldots, \overline{BN_M}=0$) and therefore the current output from the DAC 20 is equal to $I_{DAC}=(+1+1 \ldots +1)*I_{LSB}=M*I_{LSB}$.

It will be appreciated that, while primarily referred to a current-based implementation of the DAC 20 as exemplified in FIG. 1, the discussion related to FIGS. 3 and 4 applies mutatis-mutandis (e.g., the voltage-to-current translator resistors at the output of the DAC 20) to a voltage-based implementation of the DAC 20 as exemplified in FIG. 2.

It will be similarly appreciated that the previous discussion related to FIGS. 1 to 4 (including FIG. 3A) essentially corresponds to conventional solutions, which makes it unnecessary to provide a more in-depth analysis and description.

Such a previous discussion is primarily intended to facilitate the understanding of embodiments as discussed in the following in connection with FIGS. 5 to 14.

For that reason, in FIGS. 5 to 14, parts or elements like parts or element already discussed in connection with FIGS. 1 to 4 are indicated by like reference symbols and—unless otherwise indicated in the following—the detailed description of these parts and elements provided in connection with FIGS. 1 to 4 will apply to like parts and elements FIGS. 5 to 14 and will not be repeated for brevity.

One or more embodiments as discussed in the following in connection with FIGS. 5 to 14 are based on the recognition that in solutions as exemplified in FIG. 4—during the phase/state with RTZ=0—the current flows towards GND and towards VDD in a useless manner, thus unnecessarily increasing current consumption.

Conversely, in one or more embodiments as discussed in the following, such a current can be used to provide offset correction, thus saving on the current used for offset correction.

In addition to providing savings in terms of (average) current dissipated, one or more embodiments will also facilitate saving semiconductor area: in one or more embodiments no specific, additional offset correction circuitry is needed insofar as offset correction can be performed at the feedback loop itself (DAC 20).

Figure 5:
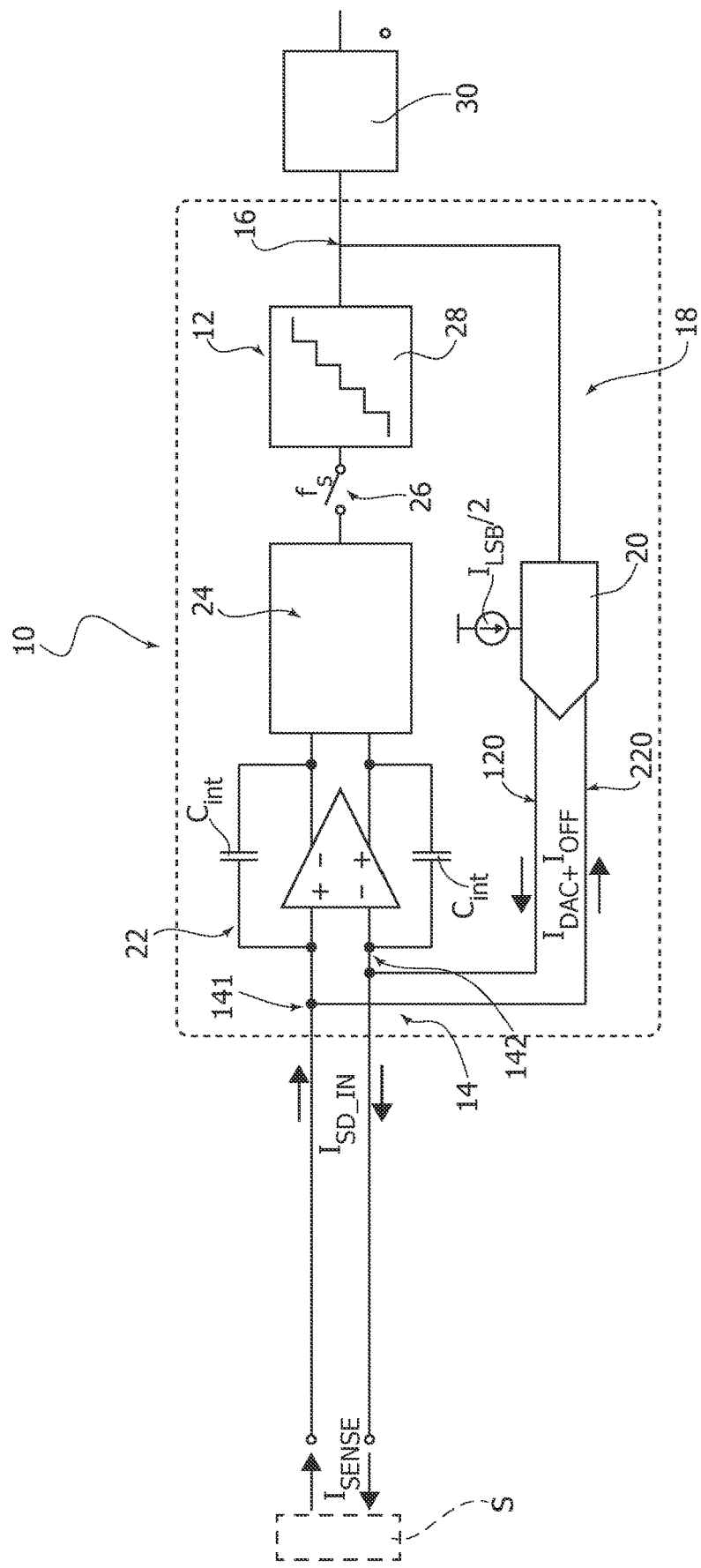
FIG. 5 is a block diagram of a converter according to embodiments of the present description in a current-based implementation.
Figure 6:
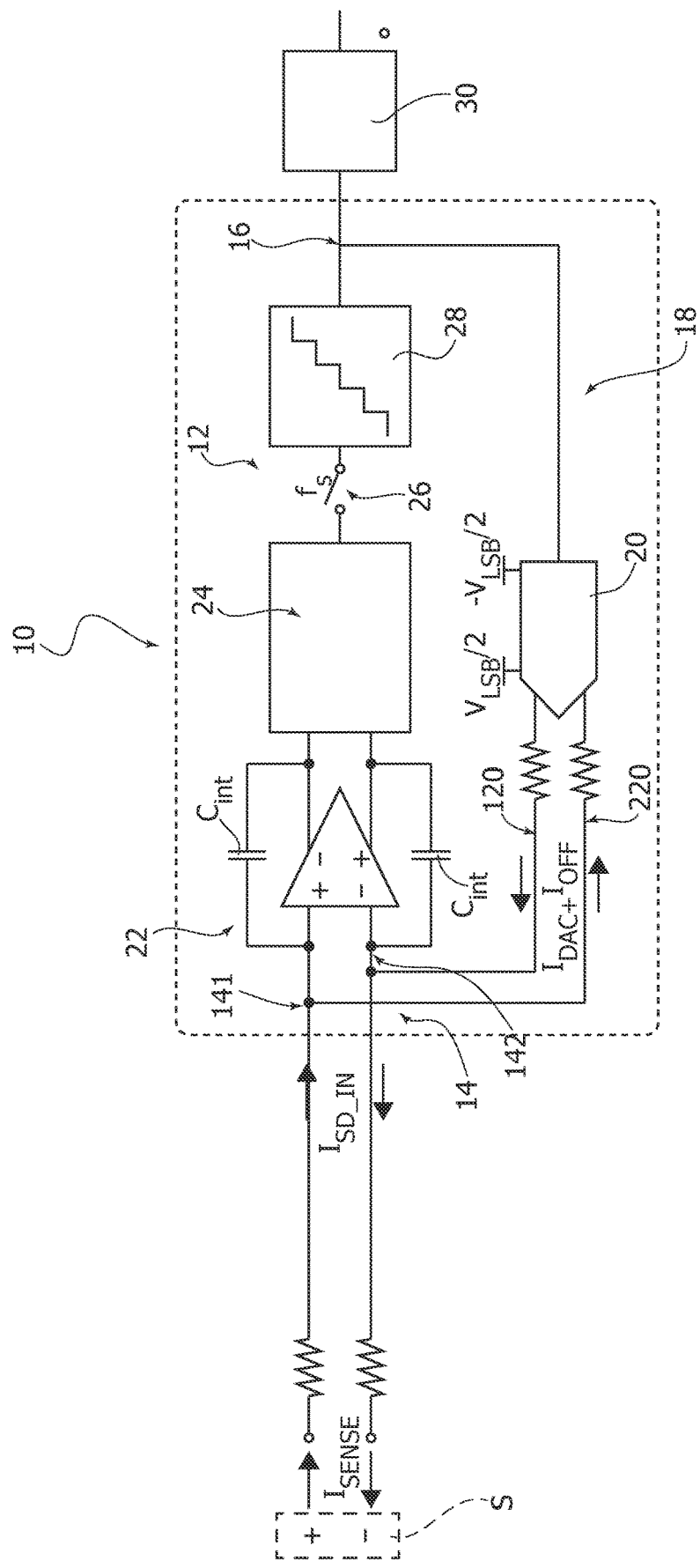
FIG. 6 is a block diagram of a converter according to embodiments of the present description in a voltage-based implementation.

Direct comparison of FIGS. 1 and 2 with FIGS. 5 and 6 shows that one or more embodiments again relate to current-based (FIG. 5) and voltage-based (FIG. 6) continuous-time converter circuits 10 comprising an analog-to-digital signal conversion path (amplifier/integrator 22, rest of loop filter 24, sampling switch 26 operating at a frequency $f_s$, M-level quantizer 28) from an input port 14 configured to receive an analog input signal $I_{SD\_IN}$ having an offset $I_{OFF}$ to be compensated) to an output port 16 configured to deliver a digital output signal quantized over M levels resulting from conversion to digital of the analog input signal.

A digital decimation filter 30 can be optionally coupled to the output port 16.

The converter circuits 10 exemplified in FIGS. 5 and 6 also comprise a digital-to-analog feedback path 18 from the output port 16 to the input port 14, with such a feedback path comprising a digital-to-analog converter 20 configured to sense and convert to analog the digital output signal and to apply an analog feedback signal at the input port 14.

The converter circuits 10 exemplified in FIGS. 5 and 6 may again advantageously adopt a differential configuration where the input port 14 to the analog-to-digital conversion path 12 again comprises a differential input 14 with a first input node 141 and a second input node 142 configured to receive the analog input signal input signal $I_{SD\_IN}$ applied therebetween.

In the converter circuits 10 exemplified in FIGS. 5 and 6, the digital-to-analog converter 20 in the digital-to-analog feedback path 18 comprises a first output line 120 and a second output line 220 configured to apply an analog (current) feedback signal at the first input node 141 and the second input node 142 of the input port 14 of the analog-to-digital signal conversion path.

The similarity of definitions and reference symbols in FIGS. 1 and 2 and FIGS. 5 and 6 evidences that, unless otherwise indicated in the following, the description of certain details of implementation provided previously in connection with FIGS. 1 and 2 applies to FIGS. 5 and 6: a description of these like details will not be repeated here for brevity.

This also applies (unless otherwise indicated in the following) to the possibility for the digital-to-analog converter 20 in the digital-to-analog feedback path 18 to comprise (see FIGS. 8 and 9 for a current-based implementation and a voltage-based implementation, respectively) a plurality of M electronic switch cells, $201, \ldots, 20j, \ldots, 20M$, where M again equals the number of levels of the quantizer 28 and the number of bits in $B_1, B_2, \ldots, B_M$, for instance.

In the converter circuits 10 exemplified in FIGS. 5 to 9, the cells $201, \ldots, 20j, \ldots, 20M$ are switchable to a conductive state, during which these cells electrically couple the first output line 110 and the second output line 120 to a first signal source 20A and to a second signal source 20B, respectively.

Figure 7:
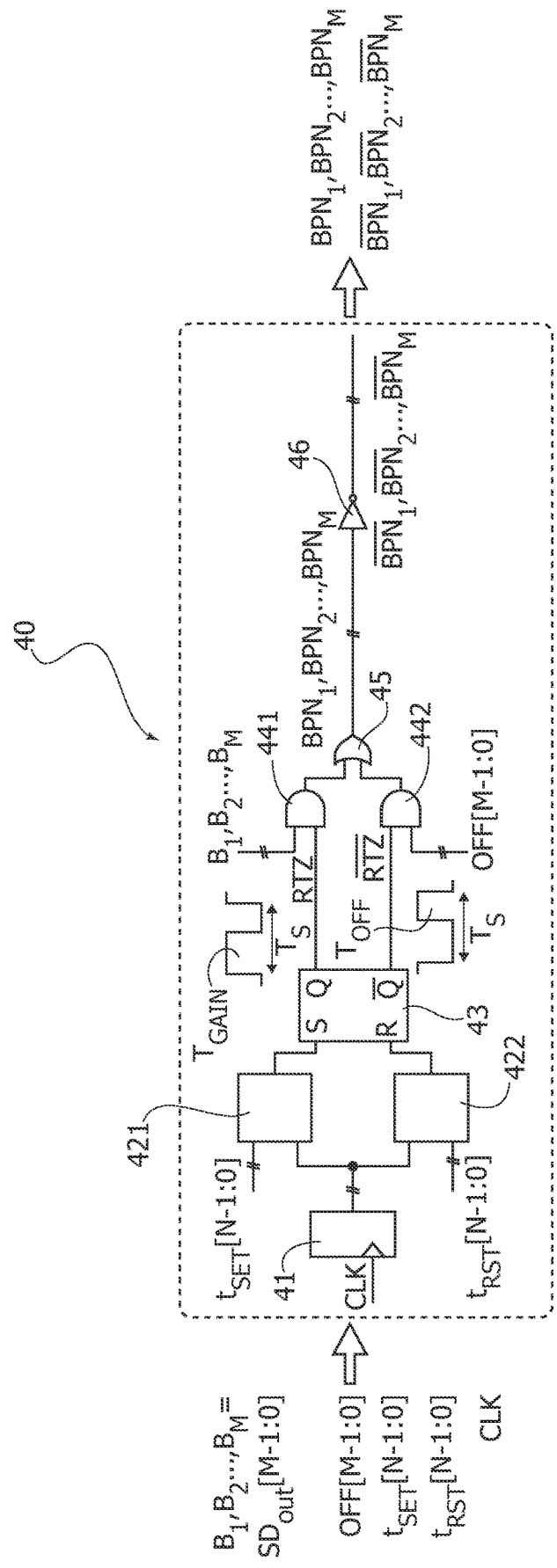
FIG. 7 is a circuit diagram illustrating possible details of a converter according to either one of FIG. 5 or FIG. 6.

In the converter circuits 10 exemplified in FIGS. 5 to 9, operation of the cells $201, \ldots, 20j, \ldots, 20M$ can be controlled by logic control circuitry 40 as exemplified in FIG. 7.

Figure 8:
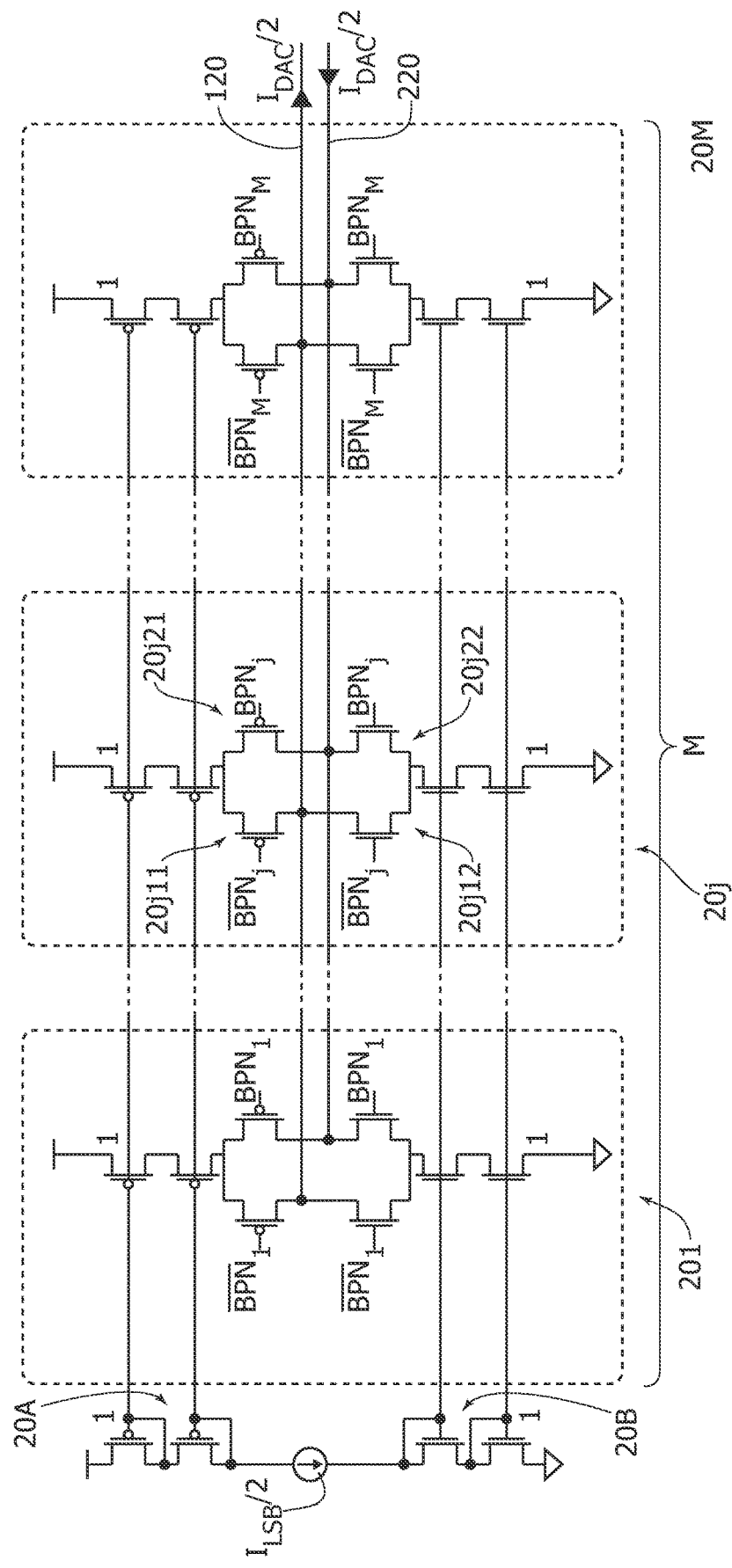
FIG. 8 is a circuit diagram illustrating possible details of a converter according to FIG. 5.
Figure 9:
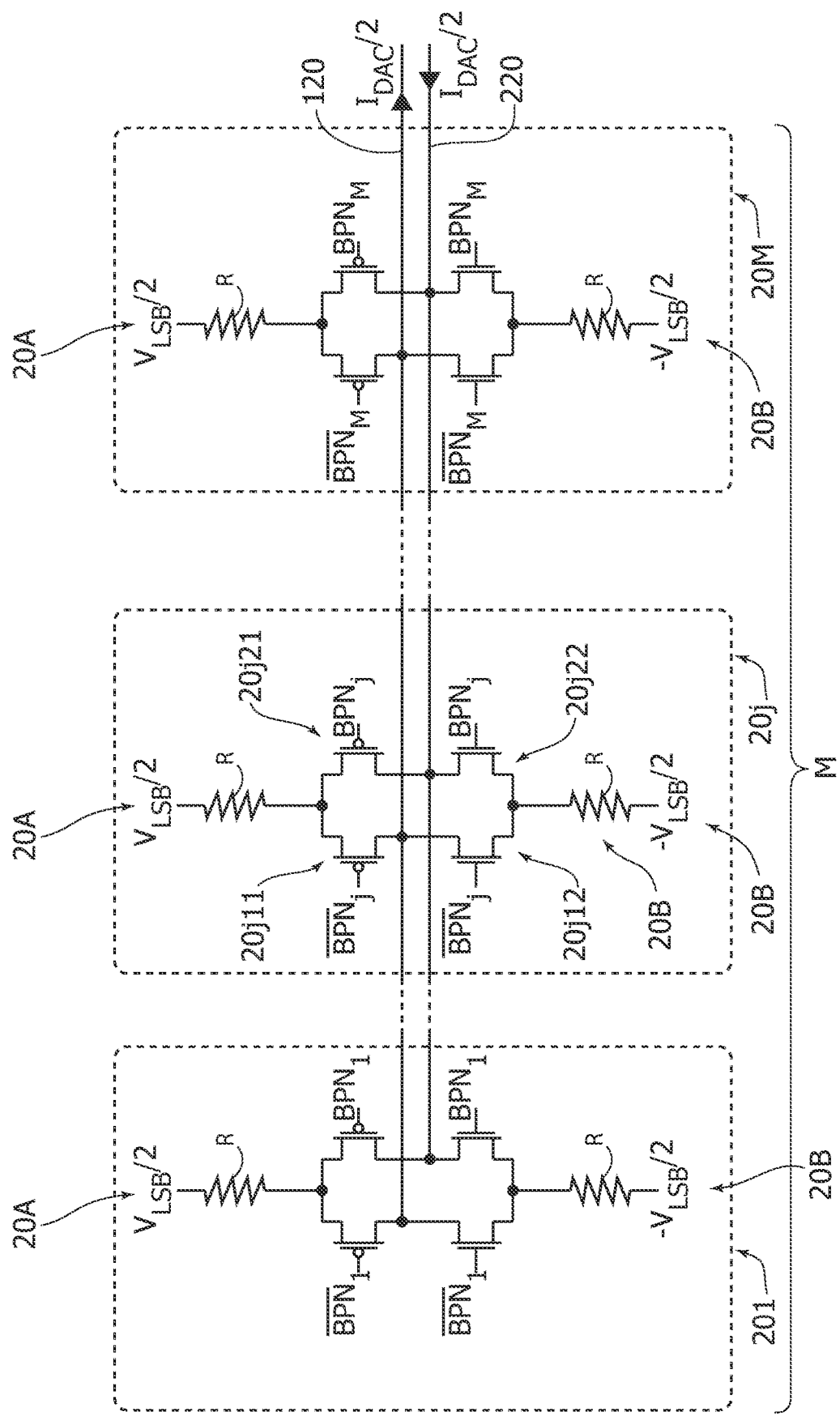
FIG. 9 is a circuit diagram illustrating possible details of a voltage-based converter according to FIG. 6.

That is, in the converter circuits 10 exemplified in FIGS. 5 to 9 the digital-to-analog converter 20 may essentially comprise M cells as exemplified in FIG. 8 (current-based implementation) or FIG. 9 (voltage-based implementation) plus logic control circuitry 40 as exemplified in FIG. 7.

In one or more embodiments as exemplified in FIGS. 8 and 9, the electronic switch cells $201, \ldots, 20j, \ldots, 20M$ may again comprise electronic switches such as transistors.

MOSFET transistors (both P-type and N-type) are again exemplary of such electronic switches which can be made selectively conductive or non-conductive with the current flow path therethrough (source-drain in the case of field-effect transistors such as MOSFETs) made current-pervious and current-impervious as a function of a (logic) signal applied to a control electrode (gate, in the case of field-effect transistors such as MOSFETs).

Here again, the logic control signals applied can take opposite values depending on whether a P-type or a N-type transistor is used to implement a certain electronic switch at a certain location.

In the—purely exemplary—case considered herein, the cells 201 to 20M again comprise (reference is made to a generic cell $20j$ with $j=1, \ldots, M$):

a first electronic switch pair $20j11, 20j12$ comprising a first and a second electronic switch (P-MOS and N-MOS transistors, for instance) which, during their conductive state, couple the first output line 120 to the first signal source 20A and the second signal source 20B, respectively, a second electronic switch pair $20j21, 20j22$ comprising a (further) first and a (further) second electronic switch (P-MOS and N-MOS, transistors for instance) which, during their conductive state, couple the second output line 220 to the first signal source 20A and the second signal source 20B respectively.

Control nodes (gates in the case of field effect transistors such as MOSFET transistors) are provided configured to selectively provide a conductive state of these switches (transistors) $20j11$, $20j12$, $20j21$, $20j22$ as a function of the logical state of a respective digital signal applied thereto.

Once more, the following discussion refers to arrangements where the transistors $20j11$, $20j12$ are P-MOS and the transistors $20j21$, $20j22$ are N-MOS receiving at the control electrodes (gates) logic signals produced by the logic circuitry 40 of FIG. 7—as a function—a return-to-zero signal RTZ produced as discussed in the following. The signal RTZ is an on-off (two-state) signal with a period Ts comprising an "on" time or state (hereinafter referred to a $T_{GAIN}$ for reason which will become clearer in the following) or and an "off" time or state $T_{OFF}$, thus with a duty cycle given by $t_{GAIN}/(t_{GAIN}+t_{OFF})$.

Like FIGS. 3 and 4 discussed previously, FIGS. 8 and 9 provide just possible examples of how operation of the cells $201, \ldots, 20j, \ldots, 20N$ as discussed can be obtained as a function of RTZ (possibly including the binary complementary or negated version thereof, namely $\overline{RTZ}$) and other logical signals generated by the logic circuitry 40 as exemplified in FIG. 7.

Based on the disclosure provided herein, those of skill in the art may devise a variety of alternative solutions where the same operation of the cells $201, \ldots, 20j, \ldots, 20N$ can be obtained as a function of RTZ using different circuitry, for instance if different types of switches are used for $20j11$, $20j12$, $20j21$, $20j22$ (N-MOS in the place of P-MOS, just to make an example).

FIGS. 5 and 6 are exemplary (by direct comparison with FIGS. 1 and 2) of embodiments where offset correction is effected in the DAC 30, without the provision of additional circuitry such as OC in FIGS. 1 and 2 with the drawbacks associated therewith as discussed previously.

In one or more embodiments as exemplified in FIGS. 5 to 9, a sensing signal $I_{SD\_IN}$ (to be amplified and converted to digital in the converter 10) can be obtained from a sensor S either directly as a current signal $I_{SENSE}$ (FIG. 5) or as a result of conversion of a voltage signal $V_{SENSE}$ via transduction resistors (visible and not explicitly labeled for simplicity in FIG. 6).

As in the case of $I_{OFF}$ discussed previously in connection with FIGS. 1 and 2, in one or more embodiments as exemplified in FIGS. 5 to 9, an offset component expected to be present in the sensing can be calculated during the calibration phase and subtracted (removed) from $I_{SD\_IN}$ the by DAC 20.

The current integrated by the converter integrator 22 (to be amplified and converted into digital) will thus include only the "useful" signal component (indicative of the physical quantity sensed by the sensor S).

In one or more embodiments as exemplified in FIGS. 5 to 9, correction of the input signal for offset can be effected using the circuitry of the DAC 20. This may be beneficial both in terms of current consumption of the converter 10 as a whole and in terms of semiconductor area occupation (the specific offset correction circuitry OC as illustrated in FIGS. 1 and 2 can be avoided).

As in the case of FIGS. 1 and 2, FIGS. 5 and 6 refer to "current-based" and "voltage-based" implementations of the DAC 20, respectively. The discussion of FIG. 5 (and FIG. 8) can thus be held to extend to FIG. 6 (and FIG. 9), taking into account the possible presence (in the place of current sources as illustrated in FIGS. 5 and 8) of voltage current sources as illustrated in FIGS. 6 and 9 with associated voltage-to-current transduction resistors.

Embodiments as exemplified in FIG. 5 (and FIG. 8) and embodiments as exemplified in FIG. 6 (and FIG. 9) may thus share a same logic control circuitry 40 as exemplified in FIG. 7, which is configured to receive as an input:

a digital "thermometric" word SDout [M−1: 0], which for simplicity can again be assumed to coincide with the digital output from the M-bit converter 28 including bits $B_1$, $B_2, \ldots, B_M$, a digital offset correction word OFF [M−1: 0], which is (another) M-bit digital word used to control the value of the $I_{OFF}$ current to be compensated, that is, the offset correction to be achieved, $t_{SET}$ [N−1: 0] and $t_{RST}$ [N−1: 0], that is, two N-bit words used to define over time the rising edges and the falling edges, respectively (and thus the duty cycle) of the signal RTZ and the negated version thereof namely $\overline{RTZ}$.

The circuitry 40 is configured to be clocked by a clock signal CLK with a period $T_{CLK}$, generated—like the other signals considered in the foregoing—in any manner known to those of skill in the art.

As exemplified in FIG. 7, the clock signal CLK drives a N-bit counter 41 that generates a count signal which is compared at two comparators 421, 422 (having thresholds set as a function of $t_{SET}$ [N−1: 0] and $t_{RST}$ [N−1: 0]) to define the rising/falling edges of RTZ (and, complementarily, $\overline{RTZ}$) as discussed previously.

For example, assuming the counter 41 is at N=8 bit counter counting continuously (cyclically) from 0 to 255 (or $2^8-1$) with an increase on each edge of the clock period $T_{CLK}$ of the signal CLK, a sampling period Ts can be selected at $256*T_{CLK}$ (for instance).

If (still by way of non-limiting example) $t_{SET}=2$ and $t_{RST}=202$ are selected as the counts producing rising and falling edges, respectively, then the RTZ signal will go "high" on the second count and "low" on the 202-th count.

Therefore, the signal RTZ will exhibit an "on" state or time over $T_{GAIN}=(202-2)*T_{CLK}=200*T_{CLK}$ and an "off" state or time over $T_{OFF}=56*T_{CLK}$.

That is, the counter 41 in combination with the two N-bit comparators 421, 422 (with thresholds set via the words $t_{SET}$ [N−1: 0] and $t_{RST}$ [N−1: 0]) and a Set-Reset (SR) flip-flop 43 may facilitate controlling the duty-cycle of the RTZ signal (and consequently of the signal $\overline{RTZ}$ which is its negated/binary complementary), that is the duration of the $T_{GAIN}$ and $T_{OFF}$ states (time intervals) of the two-level signal RTZ.

As exemplified in FIG. 7:

the Q output of the flip-flop 43 provides the signal RTZ to an AND gate 441 which receives as another input the M-bit word $B_1, B_2, \ldots, B_M$, the (neg)Q output of the flip-flop 43 provides the signal $\overline{RTZ}$ to an AND gate 442 which receives as another input the M-bit offset correction word OFF [M−1: 0].

The outputs from the AND gates 441, 442 in turn provide the inputs to an OR gate 45 which produces signals $BPN_1$, $BPN_2, \ldots, BPN_M$. These signals (together with their negated or logical complementary replicas produced by an inverter 46) are used to drive the DAC cell network of FIG. 8 (current-based implementation) and FIG. 9 (voltage-based implementation).

In the DAC network of FIG. 8, when the signal RTZ=0 (that is, when $\overline{RTZ}$=1), namely in the $T_{OFF}$ time or state of RTZ, and OFF[M−1: 0]=0, . . . 0, then $BPN_1$, $BPN_2, \ldots,$ $BPN_M=0, 0, \ldots 0$ and $\overline{BPN_1}, \overline{BPN_2}, \ldots, \overline{BPN_M}=1, 1, \ldots 1$, so that the current from the DAC 20 is equal to $I_{OFF}=(-1-1 \ldots -1)*I_{LSB}=-M*I_{LSB}$.

When RTZ=0 and OFF [M−1: 0]=1, 0, . . . , 0, then $BPN_1=1, BPN_2, \ldots, BPN_M=0$ ($\overline{BPN_1}=0$ and $\overline{BPN_2}, \ldots, \overline{BPN_M}=1$) and therefore the current output from the DAC 20 is equal to $I_{OFF}=(+1-1 \ldots -1)*I_{LSB}=(-M+2)*I_{LSB}$.

Finally, when RTZ=0 and OFF [M−1: 0]=1, 1, . . . , 1, then $BPN_1, BPN_2, \ldots, BPN_M=1, 1, \ldots, 1$ ($\overline{BPN_1}, BPN_2, \ldots, \overline{BPN_M}=0, 0, \ldots, 0$) and therefore the current from the DAC 20 is equal to $I_{OFF}=(+1+1 \ldots +1)*I_{LSB}=M*I_{LSB}$.

The current $I_{OFF}$ is integrated (at 22) over a portion $T_{OFF}$ of the sampling period Ts and the equivalent mean value $I_{OFF\_avg}$ of the offset correction current $I_{OFF}$ can be expressed as:

$$I_{OFF\_avg} = \frac{T_{OFF}}{T_s} \cdot I_{LSB} \cdot (-M + 2 \cdot OFF) \quad (1)$$

where, in the formula above, OFF denotes a "thermometric" value of OFF [M−1: 0] converted to decimal, that is a number from 0 to M. The average current value set thus depends (only) on the M-bit word OFF [M−1: 0] (trimming word) which, once determined in calibration procedure can be stored in a non-volatile memory (not visible for simplicity).

A DAC 20 as exemplified herein can thus subtract from the current $I_{SENSE}$ coming from the sensor S in FIG. 5 a dc current value according to the formula (1). This can be regarded as a design equation that indicates the current correction feasible as a function of the trimming word OFF [M−1: 0].

It will be appreciated that in the case of a (conventional) DAC 20 as illustrated in FIG. 4 the average current value given by equation (1) would be dissipated to no advantage.

Conversely, in the case of a DAC 20 according to embodiments as exemplified in FIG. 7 and FIG. 8, that current can be used for offset correction of the input signal, thus making it possible to avoid using an offset correction network OC (see FIG. 1, for instance), which leads to saving in terms of occupation and current consumption.

In the DAC network of FIG. 8, when the signal RTZ=1 (that is, when $\overline{RTZ}=0$), namely in the $T_{GAIN}$ time or state of RTZ, and $SD_{OUT}$ [M−1: 0]=0, . . . 0, then $BPN_1, BPN_2, \ldots, BPN_M=0, 0, \ldots 0$ and $\overline{BPN_1}, \overline{BPN_2}, \ldots, \overline{BPN_M}=1, 1, \ldots 1$, so that the current from the DAC 20 is equal to $I_{DAC}=(-1-1 \ldots -1)*I_{LSB}=-M*I_{LSB}$.

When RTZ=1 and $SD_{OUT}$ [M−1: 0]=1, 0, . . . , 0, then $BPN_1=1, BPN_2, \ldots, BPN_M=0$ ($\overline{BPN_1}=0$ and $\overline{BPN_2}, \ldots, \overline{BPN_M}=1$) and therefore the current output from the DAC 20 is equal to $I_{DAC}=(+1-1 \ldots -1)*I_{LSB}=(-M+2)*I_{LSB}$.

Finally, when RTZ=1 and $SD_{OUT}$ [M−1: 0]=1, 1, . . . , 1, then $BPN_1, BPN_2, \ldots, BPN_M=1, 1, \ldots, 1$ ($\overline{BPN_1}, BPN_2, \ldots, \overline{BPN_M}=0, 0, \ldots, 0$) and therefore the current from the DAC 20 is equal to $I_{DAC}=(+1+1 \ldots +1)*I_{LSB}=M*I_{LSB}$.

If one considers that the current $I_{DAC}$ current is integrated (at 22) over a portion $T_{GAIN}$ (or $\overline{T_{GAIN}}$) of the sampling period Ts, equivalent mean value $I_{DAC\_avg}$ of the feedback current $I_{DAC}$ can be expressed as:

$$I_{DAC\_avg} = \frac{T_{GAIN}}{T_s} \cdot I_{LSB} \cdot (-M + 2 \cdot SD_{out}) \quad (2)$$

where, in the formula above, $SD_{out}$ denotes a "thermometric" value of $SD_{OUT}$ [M−1: 0] converted to decimal, that is a number from 0 to M.

In one or more embodiments, the average value of the feedback current obtained as a function of the M-bit word $SD_{OUT}$ [M−1: 0] is the same as that which can be obtained with a "conventional" DAC 20 as illustrated in FIG. 4.

In addition, in one or more embodiments, the DAC 20 also provides the offset correction current $I_{OFF}$ as expressed in equation (1) above, which can be used to achieve the offset correction.

FIG. 9 presents a possible voltage-based implementation of a DAC as exemplified of FIG. 8 in a current-based implementation.

In FIG. 8, the signal sources 20A, 20B are implemented as rails of "head" and "tail" current mirror pairs that mirror the current $I_{LSB}/2$ onto the bias cells 201, . . . , 20j, . . . , 20M.

Conversely, in FIG. 9, the signal sources 20A, 20B are implemented as opposed "head" and "tail" voltage lines (at voltages $V_{LSB}/2$ and $-V_{LSB}/2$, respectively) to which the bias cells 201, . . . , 20j, . . . , 20M are coupled via voltage-to-current translator resistors (again shown but not expressly labeled in FIG. 9 for simplicity) providing conversion of $V_{LSB}$ into $I_{LSB}$.

The previous discussion of FIG. 7 in connection with FIG. 8, thus essentially applies FIG. 7 in connection with FIG. 9, with the equivalent average value $I_{OFF\_avg}$ of the offset correction current expressed as:

$$I_{OFF\_avg} = \frac{T_{OFF}}{T_s} \cdot \frac{V_{LSB}}{R} \cdot (-M + 2 \cdot OFF) \quad (3)$$

and the equivalent average value $I_{DAC\_avg}$ of the offset correction current expressed as $$I_{DAC\_avg} = \frac{T_{GAIN}}{T_s} \cdot \frac{V_{LSB}}{R} \cdot (-M + 2 \cdot SD_{out}) \quad (4)$$

Whatever the specific implementation details, controlling the durations of the $T_{GAIN}$ and $T_{OFF}$ states (time intervals) of the two-level signal RTZ ((via the thresholds set via the words $t_{SET}$ [N−1: 0] and $t_{RST}$ [N−1: 0], for instance) may facilitate controlling the duty-cycle of the signals RTZ and $\overline{RTZ}$, thus adjusting the (relative) "weight" that the components related to the M-bit words SDout [M−1: 0] and OFF [M−1: 0] have on the feedback signal applied by the DAC 20 at the input port 14 of the analog-to-digital conversion path 12.

For instance, in one or more embodiments a value for the duty cycle of the signal RTZ can be set to achieve a desired performance level in terms of SNR as discussed previously. The duration of the time interval $T_{OFF}$ can then be used to implement a desired offset correction.

Figure 10:
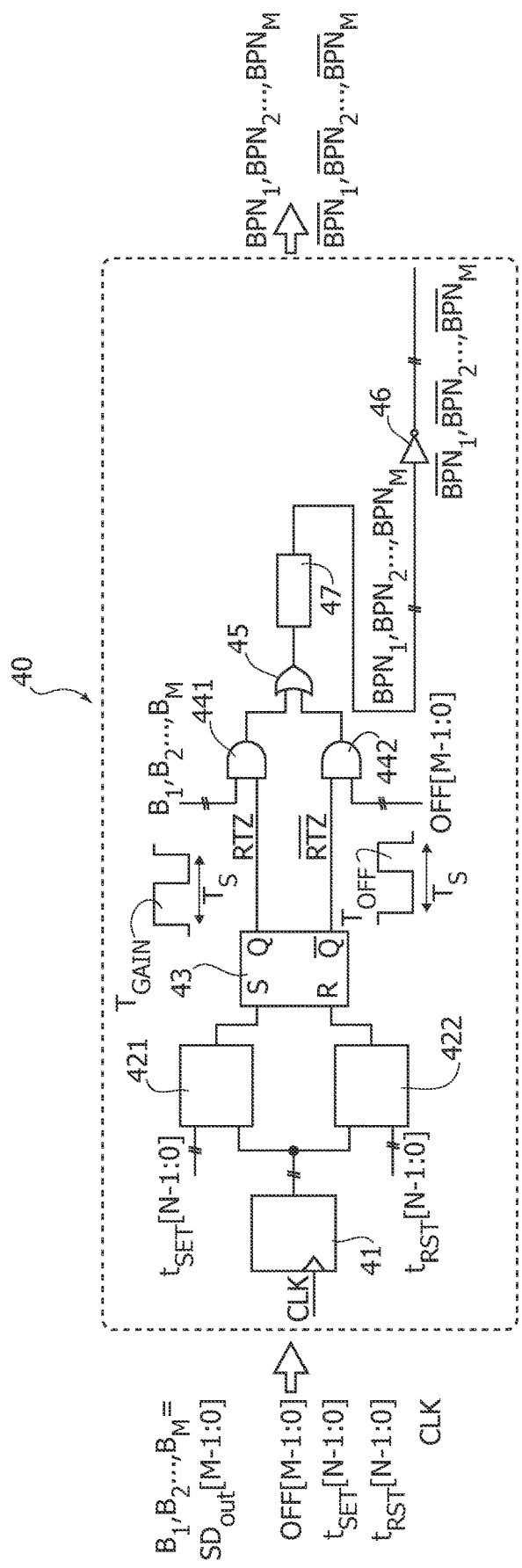
FIG. 10 is a circuit diagram illustrating possible developments of the solution illustrated in FIG. 7.

FIG. 10 illustrates an implementation of the DAC control circuitry 40 which includes a block 47 configured to implement (in a manner known to those of skill in the art) a dynamic element matching (DEM) technique.

Parts, elements or signals like parts, elements or signals already discussed in connection with FIG. 7 are indicated in FIG. 10 with like reference symbols and a corresponding detailed description will not be repeated here for brevity.

As exemplified in FIG. 10, the block 47 is arranged intermediate the OR gate 45 and the logical inverter 46 to effect a cyclic rotation (or any other similar alternation) of the control words which are applied as command signals for the cells 201, ..., 20j, ..., 20M of the DAC 20 as discussed previously.

The DEM technique is conventionally used in various contexts in order to reduce errors due to mismatch and to reduce the contribution of low frequency noise.

For example, if a bias current ratio of 1:m is generated, then using (m+1) bias branches, each of these (m+1) branches can be used cyclically as a reference branch to generate the current m times bigger. This will result in (m+1) possible combinations, or a cyclic rotation of (m+1) combinations, each of which will have a matching error.

In cases where a decimation filter such as 30 is present downstream of a converter (see FIG. 5 and FIG. 6) which produces output values averaged using multiples of (m+1) converter output data, the effect due to the matching error of the current branches will be averaged for these values.

FIG. 10 is thus exemplary of the possibility of applying DEM processing to one or more embodiments, either current-based or voltage-based. Such DEM processing will have effect on the output signal from the DAC signal both in respect of the feedback signal, which is a function of the converter output from the quantizer 28 (namely a function of $SD_{OUT}$ [M−1: 0]) and in respect of the offset correction signal (namely a function of OFF [M−1: 0]), FIGS. 11 and 12 illustrate implementations (current-based in FIG. 11 and voltage-based in FIG. 12) of the DAC control circuitry 40 and the cells 201, ..., 20j, ..., 20M aiming at reducing the minimum offset correction step.

Here again, parts, elements or signals like parts, elements or signals already discussed in connection with FIG. 7 (and FIG. 10) are indicated with like reference symbols and a corresponding detailed description will not be repeated here for brevity.

Also, while not illustrated for simplicity, the features discussed in connection with FIGS. 11 and 12 lend themselves to be possibly used in combination with DEM processing discussed in connection with FIG. 10.

Figure 11:
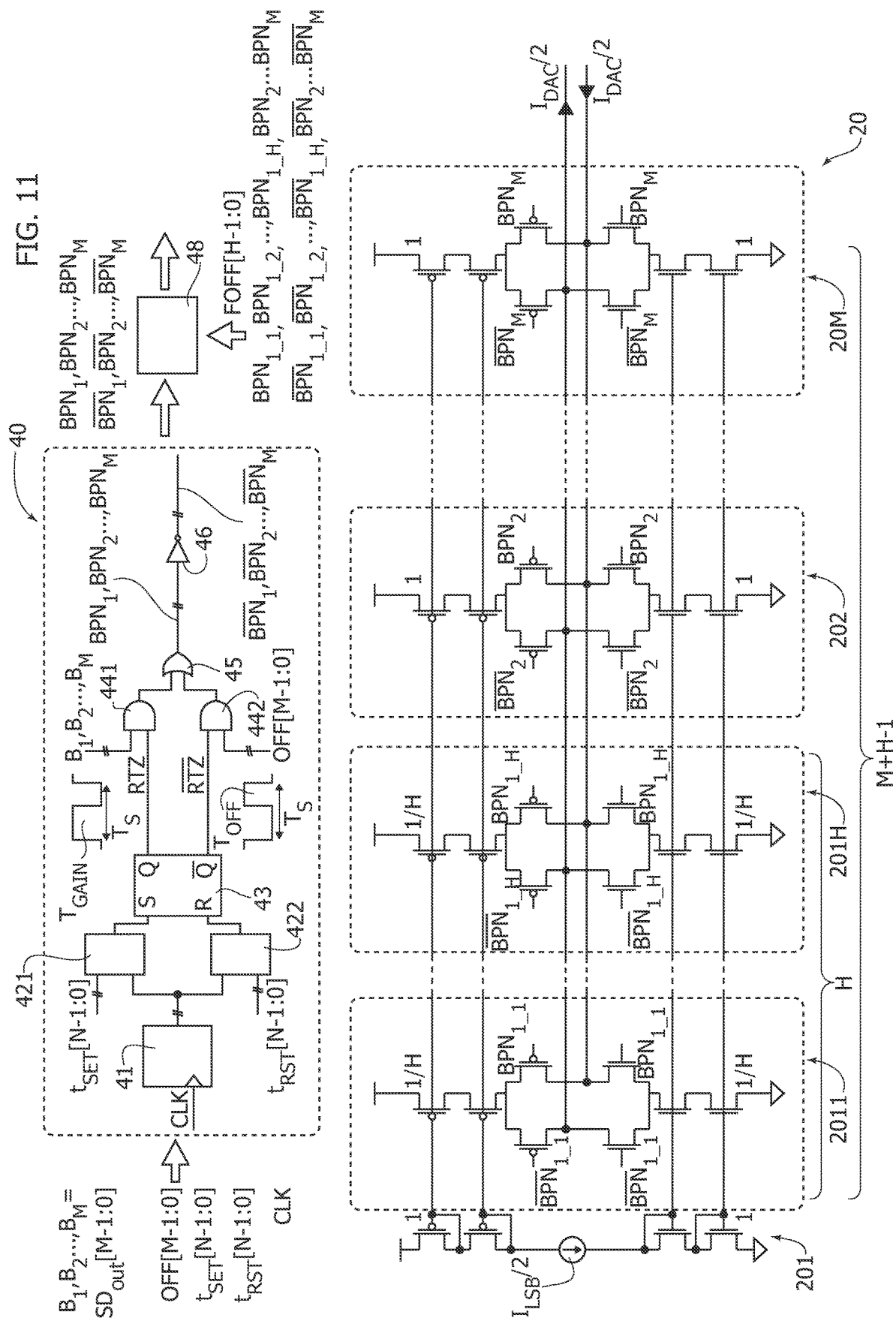
FIG. 11 is a circuit diagram illustrative of possible developments of a current-based converter according to FIG. 5.

Briefly, the implementations exemplified in FIGS. 11 and 12 are based on the recognition that—as shown by the diagrams of FIG. 7 and FIG. 8 and equation (1)—a unitary increase in the "OFF" value produces a variation in the average value of the offset correction current equal to:

$$I_{OFF\_avg\_STEP} = \frac{T_{OFF}}{T_s} \cdot I_{LSB} \cdot 2 \quad (5)$$

In FIG. 11 the cells 201, ..., 20j, ..., 20M of the DAC 20 have the same general topology exemplified in FIG. 8, with the difference that one of the cells (the cell 201, for instance) is "split" into H branches (sub-cells) each of which produces a current which is 1/H of (that is H times smaller than) the unitary current contribution from the respective cell (the cell 201, for instance) as a whole.

A corresponding DAC control circuitry 40 as proposed in FIG. 11 is essentially the same as exemplified in FIG. 7 (or FIG. 1) with the addition of a fine offset logic block 48 configured to "refine" the logic underlying generation of the control signals.

In embodiments as exemplified in FIG. 7 (and FIGS. 8 and 9) the logic 40 can be based on the scheme reported in Table 1 which follows. This table summarizes possible values of the command bits when RTZ=0 (i.e., during the $T_{OFF}$ period during which offset correction is performed):

TABLE 1 generation of logic signals in FIG. 7

| M<br>4<br>BPN$_4$ =<br>OFF[3] | $I_{LSB}$<br>1.00E−6<br>BPN$_3$ =<br>OFF[2] | $T_{OFF}$/Ts<br>0.5<br>BPN$_2$ =<br>OFF[1] | BPN$_1$ =<br>OFF[0] | $I_{OFF\_avg}$ | $I_{OFF\_avg\_STEP}$ |
|---|---|---|---|---|---|
| 0 | 0 | 0 | 0 | −2.00E−6 | |
| 0 | 0 | 0 | 1 | −1.00E−6 | 1.00E−6 |
| 0 | 0 | 1 | 1 | 0 | 1.00E−6 |
| 0 | 1 | 1 | 1 | 1.00E−6 | 1.00E−6 |
| 1 | 1 | 1 | 1 | 2.00E−6 | 1.00E−6 |

By way of contrast, in embodiments as exemplified in Figure ii the logic 40 can be based on following Table 2 may apply.

TABLE 2 generation of logic signals in FIG. 11

| M<br>4<br>BPN$_4$ = OFF<br>[3] | H<br>3<br>BPN$_3$ = OFF<br>[2] | $I_{LSB}$<br>1.00E−6<br>BPN$_2$ =<br>OFF[1] | $T_{OFF}$/Ts<br>0.5<br>BPN$_{1\_3}$ =<br>OFF[2] | BPN$_{1\_2}$ =<br>OFF[1] | BPN$_{1\_1}$ =<br>OFF [0] | $I_{OFF\_avg}$ | $I_{OFF\_avg}$ |
|---|---|---|---|---|---|---|---|
| 0 | 0 | 0 | 0 | 0 | 0 | −2.00E−6 | |
| 0 | 0 | 0 | 0 | 0 | 1 | −1.67E−6 | −333.33E−9 |
| 0 | 0 | 0 | 0 | 1 | 1 | −1.33E−6 | 333.33E−9 |
| 0 | 0 | 0 | 1 | 1 | 1 | −1.00E−6 | 333.33E−9 |
| 0 | 0 | 1 | 0 | 0 | 1 | −666.67E−9 | 333.33E−9 |
| 0 | 0 | 1 | 0 | 1 | 0 | −333.33E−9 | 333.33E−9 |
| 0 | 0 | 1 | 1 | 1 | 1 | 0 | 333.33E−9 |
| 0 | 1 | 1 | 0 | 0 | 1 | 333.33E−9 | 333.33E−9 |
| 0 | 1 | 1 | 0 | 1 | 1 | 666.67E−9 | 333.33E−9 |
| 0 | 1 | 1 | 1 | 1 | 1 | 1.00E−6 | 333.33E−9 |
| 1 | 1 | 1 | 0 | 0 | 1 | 1.33E−6 | 333.33E−9 |
| 1 | 1 | 1 | 0 | 1 | 1 | 1.67E−6 | 333.33E−9 |
| 1 | 1 | 1 | 1 | 1 | 1 | 2.00E−6 | 333.33E−9 |

The table above shows that embodiments as exemplified in FIG. 11 may implement a H times "finer" correction step equal to:

$$I_{OFF\_avg\_STEP} = \frac{T_{OFF}}{T_s} \cdot I_{LSB} \cdot 2 \cdot \frac{1}{H} \quad (6)$$

During the phase with RTZ=1 (that is during the $T_{GAIN}$ period where the DAC 20 is driven as a function of the signal SDout [M−1: 0] (in the place of the "trimming" word OFF [M−1: 0] for offset compensation) the H sub-cells 2011, ..., 201H are all driven by the $B_1$ bit (that is $BPN_{1\_1}$, $BPN_{1\_2}$, ..., $BPN_{1\_H}$=SDout[0]=$B_1$).

In other words, during the RTZ=1 phase, the H sub-cells 2011, ..., 201H are driven "constructively" together to recompose the unit current element expected to be provide by the cell 201.

In that way, operation in the phase RTZ=1 is maintained unchanged, without impacting and without modifying the feedback function of the converter.

The same remarks made in the foregoing in respect of the "current-based" implementation of FIG. 11 also apply to the "voltage-based" implementation of FIG. 12, where the cells 201, ..., 20j, ..., 20M (and primarily the cell 201 exemplary of a cell "split" into H sub-cells 2011, ..., 201H) have the structure previously discussed in connection with FIG. 9.

The exemplary "voltage-based" implementation of FIG. 12, may thus provide a H times "finer" correction step equal to:

$$I_{OFF\_avg\_STEP} = \frac{T_{OFF}}{T_s} \cdot \frac{V_{LSB}}{R} \cdot 2 \cdot \frac{1}{H} \quad (7)$$

Finally, FIGS. 13 and 14 illustrate implementations (current-based in FIG. 13 and voltage-based in FIG. 14) of the DAC control circuitry 40 and the cells 201, ..., 20j, ..., 20M aiming at increasing the full-scale of offset correction.

Once more, parts, elements or signals like parts, elements or signals already discussed in connection with FIGS. 7 thru 12 are indicated with like reference symbols and a corresponding detailed description will not be repeated here for brevity.

Again, while not illustrated for simplicity, the features discussed in connection with FIGS. 13 and 14 lend themselves to be possibly used in combination with the DEM features discussed in connection with FIG. 10, and in FIGS. 11 (current-based implementation of FIG. 13) and 12 (voltage-based implementation of FIG. 14)).

Briefly, the implementations exemplified in FIGS. 13 and 14 are based on the recognition that—as shown by the diagrams of FIG. 7 and FIG. 8 and equation (1)—varying "OFF" from 0 to M leads to a full-scale variation of the average value of the offset correction current is equal to:

$$I_{OFF\_avg\_FullScale} = \pm \frac{T_{OFF}}{T_s} \cdot I_{LSB} \cdot M \quad (8)$$

In FIG. 13 the cells 201, ..., 20j, ..., 20M of the DAC 20 have the same general topology exemplified in FIG. 8, with however L additional cells 2001, 2002, ..., 200L each providing a unitary current contribution similar to the contribution of 201, 202, ..., 200M are added.

These L further cells can be configured and driven according to the technique already discussed in connection with FIG. 4 but using $\overline{RTZ}$ instead of RTZ.

Therefore, during the phase with RTZ=1 ($T_{GAIN}$ interval) the additional cells 2001, 2002, ..., 200L are not used (that is their currents are dissipated towards VDD or towards GND). Conversely, they are used during the phase with RTZ=0 ($T_{OFF}$ interval) as a function of the value of other L bits OFF[M+L−1:M] added to the M-bit trimming signal for offset compensation OFF[M−1: 0].

In embodiments as exemplified in FIG. 13, the DAC control circuitry can be essentially as illustrated in FIG. 7 for driving the first M bits (cells 201, 202, ..., 20M), while the further L bits (cells 2001, 2002, ..., 200L) can be driven as in the case of FIG. 4, with $\overline{RTZ}$ used in the place of RTZ).

One or more embodiments as exemplified in FIG. 13 may thus implement an "increased" full correction scale, equal to:

$$I_{OFF\_avg\_FullScale} = \pm \frac{T_{OFF}}{T_s} \cdot I_{LSB} \cdot (M+L) \quad (9)$$

Also in this case the operation linked to the M-bit feedback word "SDout" is not affected.

One or more embodiments as exemplified in FIG. 13 can thus be regarded as a providing a sort of "hybrid" solution between embodiments as exemplified in FIG. 7 and a conventional solution as presented in FIG. 4.

In terms of area and current consumption, one or more embodiments as exemplified in FIG. 13 may turn out to be less advantageous if compared to embodiments as exemplified in FIG. 7 (and FIG. 8). However, they are more advantageous if compared with a conventional solution as exemplified in FIG. 4 for a same full-scale offset compensation.

In FIG. 14 illustrates a possible "voltage-based" implementation of a DAC 20 for which a "current-based" implementation is illustrated in FIG. 13.

The prior discussion in FIG. 13 thus essentially applies to the implementation illustrated in FIG. 14.

An implementation as illustrated in FIG. 14 can thus provide a full scale value of the equivalent mean value of the offset correction current which can be expressed as:

$$I_{OFF\_avg\_FullScale} = \pm \frac{T_{OFF}}{T_s} \cdot \frac{V_{LSB}}{R} \cdot M \quad (10)$$

and an equivalent mean value of the feedback current which can be expressed as:

$$I_{OFF\_avg\_FullScale} = \pm \frac{T_{OFF}}{T_s} \cdot \frac{V_{LSB}}{R} \cdot (M+L). \quad (11)$$

It will be appreciated that, while possibly advantageously sharing the differential architecture (input port 141, 142; differential amplifier 22; bias cells 201, ..., 20M arranged between sources 20A, 20B; output lines 120, 220, and so on) of conventional converters 10 as discussed in connection with FIGS. 1 to 4, one or more embodiments as exemplified herein need not necessarily rely on such an architecture in order to facilitate offset correction via the M-bit (or M+L-bit) digital word OFF [M−1: 0] (or OFF [M+L−1: 0]) during the second time intervals $T_{OFF}$ which are interleaved with the first time intervals $T_{GAIN}$.

Consequently, while advantageous, such a differential architecture does not represent a mandatory feature of the embodiments.

One or more embodiments as exemplified herein may thus relate to a converter circuit (for instance, a delta-sigma converter such as 10), comprising:

an analog-to-digital signal conversion path (for instance, 12, 22, 24, 26, 28) from an input port (for instance, 14, 141, 142) to an output port (for instance, 16), the input port configured to receive an analog input signal having an offset and the output port configured to deliver a digital output signal quantized (28) over M levels, the digital output signal resulting from conversion to digital of the analog input signal, a digital-to-analog feedback path (for instance, 18, 20, 120, 220) from the output port to the input port, the feedback path comprising a digital-to-analog converter (for instance, 20) configured to apply (for instance, subtract see 120, 220) to the input port of the analog-to-digital signal conversion path an analog feedback signal produced (for instance, 201, . . . , 20M, 40) as a function of a M-bit digital word (for instance, $BPN_1, \ldots , BPN_M$, possibly in its logic complementary or negated version) under the control of a two-state signal (for instance, return-to-zero RTZ) having alternating first states (for instance, $T_{GAIN}$) and second states (for instance, $T_{OFF}$) during which the two-state signal has a first value and a second value, respectively.

In one or more embodiments as exemplified herein, the converter circuit may comprise M-bit digital word generation circuitry (for instance, 441, 442, 45, 46) sensitive to the two-state signal and configured to produce the M-bit digital word, alternately:

during the first states, as a first M-bit digital word (for instance, SDout [M−1: 0]) which is a function of the digital output signal quantized over M levels, during the second states, as a second M-bit digital word (for instance, OFF [M−1: 0]; OFF [M+L−1: 0) which is a function a correction value of the offset in the analog input signal.

In one or more embodiments as exemplified herein the digital word generation circuitry (for instance, 40) may comprise two-state signal generation circuitry (for instance, 41, 421, 422, 43) configured to produce the two-state signal having alternating first states and second states, wherein the two-state signal generation circuitry may comprise:

a counter circuit (for instance, 41) configured to be clocked by a clock signal (for instance, CLK), a counter threshold circuit (for instance, 421, 422, 43) configured to set the two-state signal to the first state and to the second state at a first count value and a second count value, respectively, of the counter circuit.

In one or more embodiments as exemplified herein the counter circuit may comprise an N-bit counter and the counter threshold circuit may comprise N-bit thresholds (for instance, $t_{SET}$ [N−1: 0]; $t_{RST}$ [N−1: 0]), defining the first count value and the second count value, respectively.

In one or more embodiments as exemplified herein the digital-to-analog converter in the digital-to-analog feedback path may comprises a plurality of M bias cells (for instance, 201, . . . , 20j, . . . , 20M) wherein each cell in the plurality of M bias cells is individually switchable, as a function of the logical value of a respective one of the bits in the M-bit digital word (for instance, $BPN_1, \ldots , BPN_M$, possibly in its logic complementary or negated version), to a conductive state during which the bias cell electrically couples at least one output line (for instance, 120, 220) of the digital-to-analog converter to at least one signal source (for instance, $I_{LSB}/2$; $V_{LSB}/2$, $-V_{LSB}/2$).

In one or more embodiments as exemplified herein resorting to a (non-mandatory) differential architecture:

the input port to the analog-to-digital conversion path may comprise a differential input with a first input node (for instance, 141) and a second input node (for instance, 142) configured to receive the analog input signal applied therebetween, the digital-to-analog converter in the digital-to-analog feedback path may comprise a first output line (for instance, 120) and a second output line (for instance, 220) configured to apply (for instance, subtract) an analog feedback signal between the first input node and the second input node of the input port of the analog-to-digital signal conversion path, the digital-to-analog converter in the digital-to-analog feedback path may comprise a plurality of M bias cells (that is equal in number to the levels of the quantized output signal, see, for instance, 201, . . . , 20j, . . . , 20M) wherein each cell in the plurality of M bias cells is individually switchable, as a function of the logical value of a respective one of the bits in the M-bit digital word, to a conductive state during which the cell electrically couples the first output line and the second output line of the digital-to-analog converter to a first signal source (for instance, 20A; $I_{LSB}/2$; $V_{LSB}/2$) and a second signal source (for instance, 20B; $I_{LSB}/2$; $-V_{LSB}/2$), respectively.

In one or more embodiments as exemplified herein, the M-bit digital word generation circuitry may comprise a dynamic matching circuit (for instance, 47) configured to receive the M-bit digital word (for instance, $BPN_1, \ldots , BPN_M$ possibly in its logic complementary or negated version) and to cyclically vary the respective one of the bits in the M-bit digital word as a function of which each cell in the plurality of M bias cells is individually switchable to the conductive state.

In one or more embodiments as exemplified herein:

the M bias cells (for instance, 201, . . . , 20j, . . . , 20M) are configured to provide respective, substantially identical bias contributions to the digital-to-analog converter, at least one (for instance, 201) of the M bias cells may comprise a set of H bias sub-cells (for instance, 2011, . . . 201H), wherein each sub-cell in the set of H bias sub-cells is configured to provide a bias current contribution to the digital-to-analog converter which is 1/H the substantially identical contribution, and the H bias sub-cells in the at least one of the M bias cells may be configured to be switched to a conductive state:

identically to one another during the first states (for instance, $T_{GAIN}$) as a function of the logical value of the respective one of the bits in the M-bit digital word to provide a respective bias contribution of the at least one of the M bias cells to the digital-to-analog converter, differently from one another during the second states (for instance, $T_{OFF}$) to provide a reduced bias contribution of the at least one of the M bias cells to the digital-to-analog converter, the reduced bias contribution being a function of the number of the sub-cells in the set of H sub-cells that are in a conductive state.

In one or more embodiments as exemplified herein, the digital-to-analog converter in the digital-to-analog feedback path may comprise a set of L supplemental bias cells (for instance, 2001, . . . , 200L) activatable during the second states, as a function of a third digital word (for instance, OFF

[M+L−1: 0]), the third digital word comprising the second M-bit digital word (OFF [M−1: 0]) supplemented by a set of L bits of correction value of the offset in the analog input signal.

In one or more embodiments as exemplified herein, the bias cells (for instance, 20₁, . . . , 20M and possibly comprising the sub-cells 201₁, . . . , 201H and/or the supplementary cells 200₁, . . . , 200L) may comprise electronic switches, optionally transistors such as MOSFET transistors.

A device as exemplified herein may comprise:

a signal source (for instance, a sensor S), the source producing an analog signal (for instance, $I_{SENSE}$, $V_{SENSE}$) having an offset, a converter circuit (for instance, a delta-sigma converter 1o) as exemplified herein, the converter circuit having the input port (for instance, 14, 141, 142) coupled to the signal source to receive therefrom the analog signal and to deliver at the output port (16) a digital output signal quantized over M levels, the digital output signal resulting from conversion to digital of the analog signal from the signal source.

A method as exemplified herein may comprise:

receiving at an input port of an analog-to-digital signal conversion path an analog input signal having an offset, delivering at an output port a digital output signal quantized over M levels, the digital output signal resulting from conversion to digital of the analog input signal, providing a digital-to-analog feedback path from the output port to the input port, the feedback path comprising a digital-to-analog converter configured to apply (for instance, subtract) at the input port an analog feedback signal produced as a function of an M-bit digital word, wherein the method may comprise producing the M-bit digital word, alternately:

during first time intervals (for instance, $T_{GAIN}$), as a first M-bit digital word (for instance, SDout [M−1: 0]) which is a function of the digital output signal quantized over M levels, during second time intervals (for instance, $T_{OFF}$) interleaved with first time intervals, as a second M-bit digital word (for instance, OFF [M−1: 0] or OFF [M+L−1: 0]) which is a function a correction value of the offset in the analog input signal.

Without prejudice to the underlying principles, the details and embodiments may vary, even significantly, with respect to what has been described by way of example only without departing from the extent of protection.

The extent of protection is determined by the annexed claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A converter circuit, comprising:
   an analog-to-digital signal conversion path from an input port to an output port, the input port configured to receive an analog input signal having an offset, and the output port configured to deliver a digital output signal quantized over M levels, the digital output signal resulting from conversion to digital of the analog input signal;
   a digital-to-analog feedback path from the output port to the input port, the feedback path comprising a digital-to-analog converter configured to apply to the input port of the analog-to-digital signal conversion path an analog feedback signal produced as a function of an M-bit digital word under control of a two-state signal having alternating first states and second states during which the two-state signal has a first value and a second value, respectively; and
   M-bit digital word generation circuitry sensitive to the two-state signal and configured to produce the M-bit digital word, alternately:
      during the first states, as a first M-bit digital word which is a function of the digital output signal quantized over the M levels; and
      during the second states, as a second M-bit digital word which is a function a correction value of the offset in the analog input signal.

2. The converter circuit of claim 1, wherein the digital word generation circuitry comprises two-state signal generation circuitry configured to produce the two-state signal having the alternating first states and second states, wherein the two-state signal generation circuitry comprises:
   a counter circuit configured to be clocked by a clock signal; and
   a counter threshold circuit configured to set the two-state signal to the first state and to the second state at a first count value and a second count value, respectively, of the counter circuit.

3. The converter circuit of claim 2, wherein the counter circuit comprises an N-bit counter, and the counter threshold circuit comprises N-bit thresholds, providing the first count value and the second count value, respectively.

4. The converter circuit of claim 1, wherein the digital-to-analog converter in the digital-to-analog feedback path comprises a plurality of M bias cells, wherein each bias cell in the plurality of M bias cells is individually switchable, as a function of a logical value of a respective one of the bits in the M-bit digital word, to a conductive state during which the bias cell electrically couples at least one output line of the digital-to-analog converter to at least one signal source.

5. The converter circuit of claim 4, wherein:
   the input port to the analog-to-digital signal conversion path comprises a differential input with a first input node and a second input node configured to receive the analog input signal applied therebetween;
   the digital-to-analog converter in the digital-to-analog feedback path comprises a first output line and a second output line configured to apply the analog feedback signal between the first input node and the second input node of the input port of the analog-to-digital signal conversion path; and
   in the conductive state, each bias cell electrically couples the first output line and the second output line of the digital-to-analog converter to a first signal source and a second signal source, respectively.

6. The converter circuit of claim 4, wherein the M-bit digital word generation circuitry comprises a dynamic matching circuit configured to receive the M-bit digital word and to cyclically vary the respective one of the bits in the M-bit digital word as a function of which each bias cell in the plurality of M bias cells is individually switchable to the conductive state.

7. The converter circuit of claim 4, wherein:
   the M bias cells are configured to provide respective, substantially identical bias contributions to the digital-to-analog converter;

at least one of the M bias cells comprises a set of H bias sub-cells, wherein each sub-cell in the set of H bias sub-cells is configured to provide a bias current contribution to the digital-to-analog converter which is 1/H the substantially identical bias contribution; and the H bias sub-cells in the at least one of the M bias cells are configured to be switched to the conductive state:
identically to one another during the first states as a function of the logical value of the respective one of the bits in the M-bit digital word to provide a respective bias contribution of the at least one of the M bias cells to the digital-to-analog converter; and
differently from one another during the second states to provide a reduced bias contribution of the at least one of the M bias cells to the digital-to-analog converter, the reduced bias contribution being a function of a number of the sub-cells in the set of H bias sub-cells that are in the conductive state.

8. The converter circuit of claim 4, wherein the digital-to-analog converter in the digital-to-analog feedback path comprises a set of L supplemental bias cells activatable during the second states, as a function of a third digital word, the third digital word comprising the second M-bit digital word supplemented by a set of L bits of correction value of the offset in the analog input signal.

9. The converter circuit of claim 4, wherein each bias cell comprises an electronic switch.

10. The converter circuit of claim 9, wherein each electronic switch comprises a metal-oxide-semiconductor field-effect transistor.

11. A device, comprising:
a signal source, the signal source configured to produce an analog signal having an offset; and
a converter circuit comprising:
an analog-to-digital signal conversion path from an input port to an output port, the input port coupled to the signal source to receive the analog signal having the offset, and the output port configured to deliver a digital output signal quantized over M levels, the digital output signal resulting from conversion to digital of the analog signal from the signal source;
a digital-to-analog feedback path from the output port to the input port, the feedback path comprising a digital-to-analog converter configured to apply to the input port of the analog-to-digital signal conversion path an analog feedback signal produced as a function of an M-bit digital word under control of a two-state signal having alternating first states and second states during which the two-state signal has a first value and a second value, respectively; and
M-bit digital word generation circuitry sensitive to the two-state signal and configured to produce the M-bit digital word, alternately:
during the first states, as a first M-bit digital word which is a function of the digital output signal quantized over the M levels; and
during the second states, as a second M-bit digital word which is a function a correction value of the offset in the analog signal.

12. The device according to claim 11, further comprising:
a digital decimation filter coupled to the output port and configured to filter the digital output signal from the output port.

13. The device of claim 11, wherein the device is integrated on a semiconductor substrate.

14. A method, comprising:
receiving, at an input port of an analog-to-digital signal conversion path, an analog input signal having an offset;
delivering, at an output port, a digital output signal quantized over M levels, the digital output signal resulting from conversion to digital of the analog input signal;
feeding back, from the output port to the input port, via a digital-to-analog feedback path comprising a digital-to-analog converter, an analog feedback signal produced as a function of an M-bit digital word; and
producing the M-bit digital word, alternately:
during first time intervals, as a first M-bit digital word which is a function of the digital output signal quantized over M levels; and
during second time intervals interleaved with the first time intervals, as a second M-bit digital word which is a function a correction value of the offset in the analog input signal.

15. The method of claim 14, further comprising:
generating a two-state signal having alternating first states and second states during which the two-state signal has a first value and a second value, respectively;
selecting the first time interval in accordance with the first value of the two-state signal; and
selecting the second time interval in accordance with the second value of the two-state signal.

16. The method of claim 15, further comprising:
individually switching a plurality of M bias cells in the digital-to-analog converter, as a function of a logical value of a respective one of the bits in the M-bit digital word, to a conductive state during which the bias cell electrically couples at least one output line of the digital-to-analog converter to at least one signal source.

17. The method of claim 16, further comprising:
differentially receiving, by first and second input nodes of the input port, the analog input signal;
applying, by first and second output lines of the digital-to-analog converter, the analog feedback signal between the first and second input nodes of the input port; and
electrically coupling, by each bias cell in the conductive state, the first output line and the second output line to a first signal source and a second signal source, respectively.

18. The method of claim 16, further comprising:
cyclically varying the respective one of the bits in the M-bit digital word as a function of which each bias cell in the plurality of M bias cells is individually switchable to the conductive state.

19. The method of claim 16, wherein at least one of the M bias cells comprises a set of H bias sub-cells, and the method further comprises:
providing, by the M bias cells, respective, substantially identical bias contributions to the digital-to-analog converter;
providing, by each sub-cell in the set of H bias sub-cells, a bias current contribution to the digital-to-analog converter which is 1/H the substantially identical bias contribution; and
switching the H bias sub-cells in the at least one of the M bias cells to the conductive state:
identically to one another during the first states as a function of the logical value of the respective one of the bits in the M-bit digital word to provide a respective bias contribution of the at least one of the M bias cells to the digital-to-analog converter; and differently from one another during the second states to provide a reduced bias contribution of the at least one of the M bias cells to the digital-to-analog converter, the reduced bias contribution being a function of a number of the sub-cells in the set of H bias sub-cells that are in the conductive state.

20. The method of claim 16, further comprising:

activating, during the second states, a set of L supplemental bias cells in the digital-to-analog converter, as a function of a third digital word, the third digital word comprising the second M-bit digital word supplemented by a set of L bits of correction value of the offset in the analog input signal.

\* \* \* \* \*